United States Patent
Kim et al.

(10) Patent No.: US 12,262,613 B2
(45) Date of Patent: Mar. 25, 2025

(54) DISPLAY APPARATUS

(71) Applicant: LG Display Co., Ltd., Seoul (KR)

(72) Inventors: Yongjae Kim, Paju-si (KR); JiYoung Ahn, Paju-si (KR); Seogshin Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 460 days.

(21) Appl. No.: 17/558,083

(22) Filed: Dec. 21, 2021

(65) Prior Publication Data

US 2022/0208884 A1 Jun. 30, 2022

(30) Foreign Application Priority Data

Dec. 30, 2020 (KR) .................. 10-2020-0188185
Nov. 5, 2021 (KR) .................. 10-2021-0151196

(51) Int. Cl.
*H01L 27/32* (2006.01)
*H01L 51/52* (2006.01)
*H10K 50/86* (2023.01)
*H10K 59/35* (2023.01)

(52) U.S. Cl.
CPC ......... *H10K 59/353* (2023.02); *H10K 50/865* (2023.02); *H10K 59/351* (2023.02)

(58) Field of Classification Search
CPC ......... H10K 50/865; H10K 50/81–818; H10K 50/00–88; H10K 50/86; H10K 59/351; H10K 59/353; H10K 59/12; H10K 59/8792; H10K 59/121; H10K 59/126; H10K 59/00–95; H10K 59/878; H10K 2102/3026
See application file for complete search history.

(56) References Cited

U.S. PATENT DOCUMENTS

| | | | |
|---|---|---|---|
| 2014/0183480 A1* | 7/2014 | Lee | ............ H10K 59/8792 438/35 |
| 2021/0202607 A1* | 7/2021 | Lee | .............. H10K 50/15 |
| 2021/0223440 A1* | 7/2021 | Wang | ........... G02F 1/134309 |
| 2022/0181400 A1* | 6/2022 | Choi | .............. H10K 50/86 |

FOREIGN PATENT DOCUMENTS

| CN | 111554828 A | * | 8/2020 | ...... H01L 27/3211 |
|---|---|---|---|---|
| KR | 10-2015-0078352 A | | 7/2015 | |
| KR | 10-2017-0110012 A | | 10/2017 | |
| KR | 10-2020-0071367 A | | 6/2020 | |

OTHER PUBLICATIONS

CN111554828A_translation (Year: 2020).*

* cited by examiner

*Primary Examiner* — Shahed Ahmed
*Assistant Examiner* — Rhys Poniente Sheker
(74) *Attorney, Agent, or Firm* — Birch, Stewart, Kolasch & Birch, LLP

(57) ABSTRACT

A display apparatus can include a first subpixel and a second subpixel disposed on a substrate; a first electrode in each of the first subpixel and the second subpixel; a light-emitting layer on the first electrode in each of the first and second subpixels; and a second electrode on the light-emitting layer, in which a structure of the first electrode in the first subpixel is different than a structure of the first electrode in the second subpixel.

10 Claims, 26 Drawing Sheets

(a)

(b)

(a)

(b)

(c)

(d)

(a)

(b)

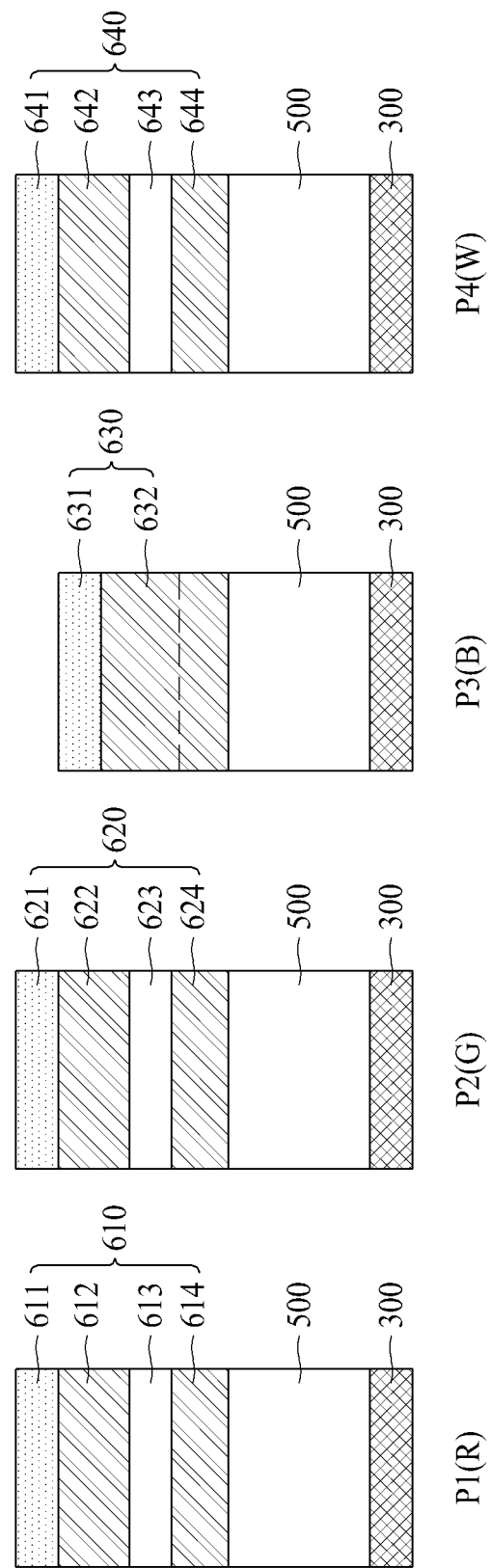

DISPLAY APPARATUS

CROSS-REFERENCE TO RELATED APPLICATIONS

This application claims priority to Korean Patent Application No. 10-2020-0188185 filed on Dec. 30, 2020 in the Republic of Korea, and Korean Patent Application No. 10-2021-0151196 filed on Nov. 5, 2021 in the Republic of Korea, the entire contents of all these applications are hereby incorporated by reference as if fully set forth herein into the present application.

BACKGROUND

Field of the Invention

The present disclosure relates to a display apparatus.

Discussion of the Related Art

With the advancement of the information age, a demand for a display device for displaying an image has increased with various forms. Therefore, various types of display devices, such as a liquid crystal display (LCD) device, a plasma display panel (PDP) and an organic light emitting display (OLED) device have been recently used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

In order to reduce the reflectance of external light of a panel in the organic light emitting display device, an anode electrode may be formed of a low reflective electrode material in a top emission scheme.

However, in the related art, although an anode electrode is formed in all subpixels in the same structure regardless of a wavelength of light emitted from each subpixel, since light wavelength bands of the respective subpixels emitting red light, green light, blue light or white light are different from each other, a problem can occur in that there can be a difference in reflectance reduction efficiency between the respective subpixels. Also, such reflections coming off of the anodes can be undesirably noticed by a user of the device, especially when in a bright room or outside (e.g., due to external sunlight).

SUMMARY OF THE DISCLOSURE

The present disclosure has been made in view of the above problems and other limitations associated with the related art, and it is an object of the present disclosure to provide a display apparatus that reduces reflectance of external light by forming an efficient low reflective electrode structure is formed for each subpixel area.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a substrate including a first subpixel and a second subpixel, a first electrode provided in each of the first subpixel and the second subpixel on the substrate, a light-emitting layer provided on the first electrode, and a second electrode provided on the light-emitting layer, in which a structure of the first electrode provided in the first subpixel and a structure of the first electrode provided in the second subpixel are different from each other.

In accordance with another aspect of the present disclosure, the above and other objects can be accomplished by the provision of a display apparatus comprising a substrate including a first subpixel and a second subpixel, a first electrode provided on the substrate, a light-emitting layer provided on the first electrode, and a second electrode provided in each of the first subpixel and the second subpixel on the light-emitting layer, in which a structure of the second electrode provided in the first subpixel and a structure of the second electrode provided in the second subpixel are different from each other. For example, the anodes in adjacent subpixels can have different structures.

BRIEF DESCRIPTION OF THE DRAWINGS

The above and other objects, features and other advantages of the present disclosure will be more clearly understood from the following detailed description taken in conjunction with the accompanying drawings, in which:

FIGS. 8A to 8I are schematic cross-sectional views illustrating a light emission area of first, second, third and fourth subpixels of a display apparatus according to an embodiment of the present disclosure.

DETAILED DESCRIPTION OF THE EMBODIMENTS

Figure 1:
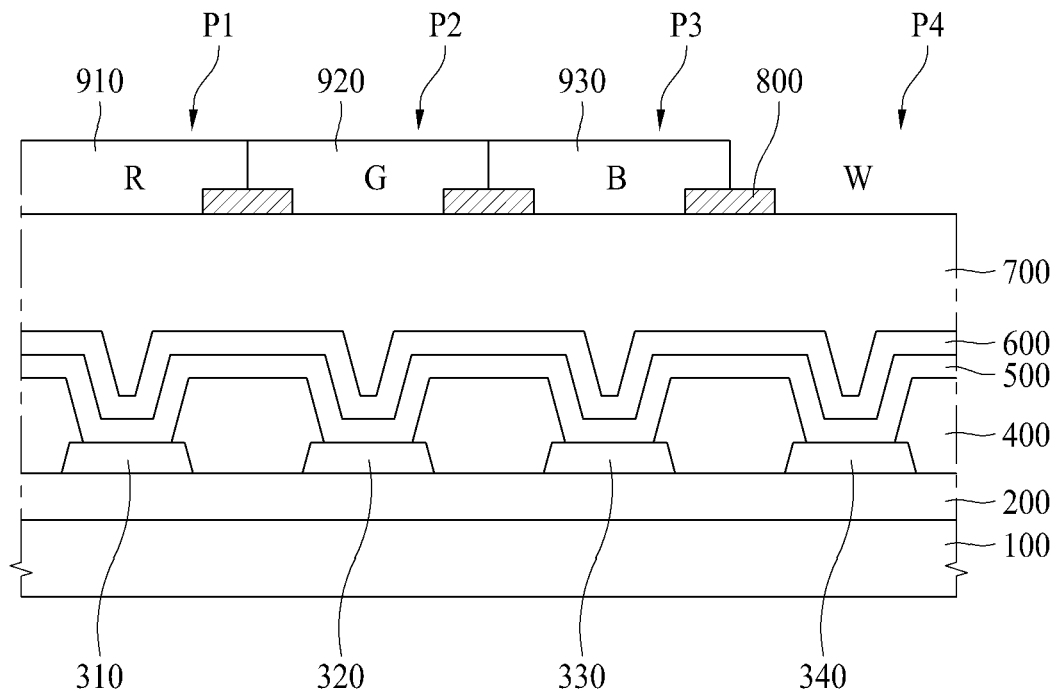
FIG. 1 is a schematic cross-sectional view illustrating a display apparatus according to an embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a situation where "comprise," "have" and "include" described in the present disclosure are used, another part may be added unless "only" is used. The terms of a singular form may include plural forms unless referred to the contrary.

In construing an element, the element is construed as including an error range although there is no explicit description.

In describing a position relationship, for example, when the position relationship is described as "upon," "above," "over," "below" and "next to," one or more portions may be arranged between two other portions unless "just" or "direct" is used.

In describing a temporal relationship, for example, when the temporal order is described as "after," "subsequent," "next" and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the embodiments of the present disclosure will be described in detail with reference to the accompanying drawings.

Figure 2:
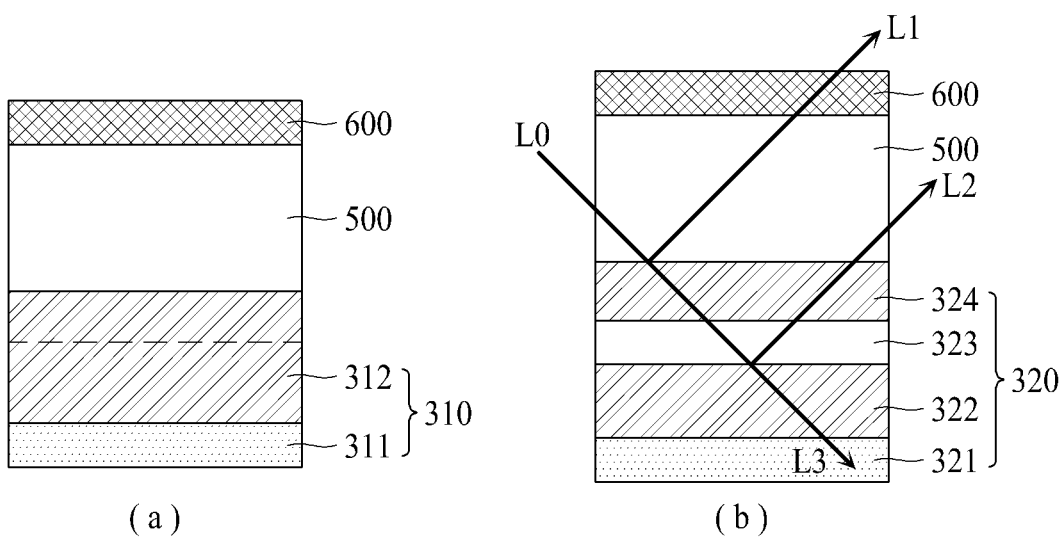
FIG. 2, including parts (a) and (b), shows schematic cross-sectional views illustrating a light emission area of an individual subpixel of a display apparatus according to an embodiment of the present disclosure.

FIG. 1 is a schematic cross-sectional view illustrating a display apparatus according to the first embodiment of the present disclosure, and parts (a) and (b) of FIG. 2 are schematic cross-sectional views illustrating a light emission area of an individual subpixel of a display apparatus according to the first embodiment of the present disclosure.

As shown in FIG. 1, the display apparatus according to the first embodiment of the present disclosure includes a substrate 100, a circuit element layer 200, first electrodes 310, 320, 330 and 340, a bank 400, a light-emitting layer 500, a second electrode 600, an encapsulation layer 700, a light-shielding layer 800, and color filters 910, 920 and 930.

The substrate 100 can be made of glass or plastic, but is not limited thereto, and can be made of a semiconductor material, such as a silicon wafer. A first subpixel P1, a second subpixel P2, a third subpixel P3 and a fourth subpixel P4 are provided on the substrate 100. The first subpixel P1 can be provided to emit red (R) light, the second subpixel P2 can be provided to emit green (G) light, the third subpixel P3 can be provided to emit blue (B) light, and the fourth subpixel P4 can be provided to emit white (W) light, but these subpixels are not limited thereto. The arrangement order of the subpixels P1, P2, P3 and P4 can be changed in various ways.

The display apparatus according to the first embodiment of the present disclosure can be comprised of a top emission scheme in which the light is emitted to an upper portion. Therefore, an opaque material as well as a transparent material can be used as the material of the substrate 100.

The circuit element layer 200 is formed on the substrate 100.

The circuit element layer 200 is provided with a circuit element, which includes various signal lines, a thin film transistor and a capacitor, for each of the subpixels P1, P2, P3 and P4. The signal lines can include a gate line, a data line, a power line and a reference line, and the thin film transistor can include a switching thin film transistor, a driving thin film transistor and a sensing thin film transistor.

The switching thin film transistor is switched in accordance with a gate signal supplied to the gate line to supply a data voltage supplied from the data line to the driving thin film transistor.

The driving thin film transistor is switched in accordance with the data voltage supplied from the switching thin film transistor to generate a data current from a power source supplied from the power line and supply the data current to the first electrodes 310, 320, 330 and 340.

The sensing thin film transistor serves to sense a threshold voltage deviation of the driving thin film transistor, which causes degradation of image quality, and supplies the current of the driving thin film transistor to the reference line in response to a sensing control signal supplied from the gate line or a separate sensing line.

The capacitor serves to maintain a data voltage supplied to the driving thin film transistor for one frame, and is connected to each of a gate terminal and a source terminal of the driving thin film transistor.

The first electrodes 310, 320, 330 and 340 are formed on the circuit element layer 200. Each of the first electrodes 310, 320, 330 and 340 are formed for each of the subpixels P1, P2, P3 and P4, and can serve as an anode of the display apparatus. The first electrodes 310, 320, 330 and 340 are connected to the driving thin film transistor provided in the circuit element layer 200.

In this situation, since the first electrodes 310, 320, 330 and 340 are made of a metal material, light incident from the outside of the display apparatus can be reflected and thus visibility of a panel may be lowered (e.g., if a user is outside on a sunny date, sunlight reflected off of the anodes may be noticeable and undesirable). Therefore, in order to reduce reflectance of light incident from the outside of the display apparatus, the first electrodes 310, 320, 330 and 340 provided in the first to fourth subpixels P1 to P4 can have their respective structures different from one another (e.g., the various anodes can have an offset type of arrangement or be staggered).

In detail, FIG. 2 part (a) illustrates a structure of the first electrode 310 provided in the first subpixel P1. The first electrode 310 provided in the first subpixel P1 includes a light-absorbing layer 311 and a first transflective electrode 312.

The light-absorbing layer 311 of the first subpixel P1 is provided on the circuit element layer 200. The light-absorbing layer 311 can be formed of a material, which absorbs light, to absorb external light incident on the first subpixel P1. For example, the light-absorbing layer 311 can be formed of a metal material, such as chromium (Cr) or nickel (Ni). In this situation, since the light-absorbing layer 311 has conductivity, the light-absorbing layer 311 can electrically be connected with the driving thin film transistor provided in the circuit element layer 200. Alternatively, the light-absorbing layer 311 can be formed of an organic material or an inorganic material, which includes a black dye. In this situation, since the light-absorbing layer 311 does not have conductivity, the light-absorbing layer 311 can include a contact hole to electrically connect the circuit element layer 200 with the first transflective electrode 312.

The first transflective electrode 312 of the first subpixel P1 is provided between the light-absorbing layer 311 and the light-emitting layer 500. The first transflective electrode 312 can reflect a portion of the light and allow another portion of the light to pass through or transmit through the first transflective electrode 312. Therefore, the light reflected from the first transflective electrode 312 can pass through a color filter to display the first subpixel P1, and the light transmitted through the first transflective electrode 312 can enter the light-absorbing layer 311 provided below the first transflective electrode 312, and then can be absorbed into the light-absorbing layer 311. Therefore, the external light can be prevented from being reflected from the first subpixel P1, and reduction in light emission efficiency of the first subpixel P1 can also be minimized. The first transflective electrode 312 can be comprised of a single layer or a multi-layer, which is made of a metal material, such as aluminum (Al), silver (Ag), copper (Cu), magnesium (Mg), molybdenum (Mo) and titanium (Ti), or their alloy.

Also, the light-absorbing layer 311 can be omitted from the first subpixel P1.

FIG. 2 part (b) illustrates a structure of the first electrode 320 provided in the second subpixel P2. The first electrode 320 provided in the second subpixel P2 includes a light-absorbing layer 321, a second transflective electrode 322, a first transparent electrode 323 and a third transflective electrode 324 (e.g., the second subpixel P2 can have a two layer transflective electrode 322,324 with the first transparent electrode 323 disposed therebetween).

The light-absorbing layer 321 of the second subpixel P2 is provided on the circuit element layer 200. The light-absorbing layer 321 can be formed of a material, which absorbs light, to absorb external light incident on the second subpixel P2. For example, the light-absorbing layer 321 can be made of a metal material, such as chromium (Cr) or nickel (Ni). In this situation, since the light-absorbing layer 321 has conductivity, the light-absorbing layer 321 can electrically be connected with the driving thin film transistor provided in the circuit element layer 200. Alternatively, the light-absorbing layer 321 can be formed of an organic material or an inorganic material, which includes a black dye. In this situation, since the light-absorbing layer 321 does not have conductivity, the light-absorbing layer 321 can include a contact hole to connect the circuit element layer 200 with the second transflective electrode 322. Also, the light-absorbing layer 321 provided in the second subpixel P2 can be formed to have the same thickness as the light-absorbing layer 311 provided in the first subpixel P1.

The second transflective electrode 322 of the second subpixel P2 is provided on the light-absorbing layer 321. The second transflective electrode 322 can reflect a portion of the light and allow another portion of the light to pass through or transmit through the second transflective electrode 322. Therefore, the light transmitted through the second transflective electrode 322 can enter the light-absorbing layer 321 provided below the second transflective electrode 322, and thus can be absorbed into the light-absorbing layer 321. At this time, the second transflective electrode 322 can be formed to be thinner than the first transflective electrode 312 to further improve transmittance/passage of the light, thereby increasing the amount of the light absorbed by the light-absorbing layer 321. The second transflective electrode 322 can be comprised of a single layer or a multi-layer, which is made of a metal material, such as aluminum (Al), silver (Ag), copper (Cu), magnesium (Mg), molybdenum (Mo) and titanium (Ti), or their alloy.

The first transparent electrode 323 of the second subpixel P2 can be formed on the second transflective electrode 322, and can be made of a transparent conductive material. For example, the first transparent electrode 323 can be formed of a single layer or multi-layer, which is made of a transparent conductive material such as indium tin oxide (ITO) and indium zinc oxide (IZO).

The third transflective electrode 324 of the second subpixel P2 is provided on the first transparent electrode 323. The third transflective electrode 324 can reflect a portion of the light and allow another portion of the light to pass through or transmit through the third transflective electrode 324. At this time, the third transflective electrode 324 can be formed to be thinner than the first transflective electrode 312 to further improve transmittance of light. Further, the third transflective electrode 324 can be comprised of a single layer or a multi-layer, which is made of a metal material, such as aluminum (Al), silver (Ag), copper (Cu), magnesium (Mg), molybdenum (Mo) and titanium (Ti), or their alloy.

That is, the second subpixel P2 can include a first electrode 320 having a structure in which the light-absorbing layer 321, the second transflective electrode 322, the first transparent electrode 323 and the third transflective electrode 324 are sequentially stacked on each other. Through the stacked structure, the second subpixel P2 can reduce reflectance of the external light more effectively than the first subpixel P1 (e.g., the first and second subpixels P1,P2 can reflect external light in different ways, thus reducing the effect on a user's eyes by scattering reflected light in different directions and dispersing it). In detail, when external light L0 enters the light emission area, the external light L0 can be distributed into light reflected on the third transflective electrode 324 and light passing through the third transflective electrode 324. First reflective light L1 reflected on the third transflective electrode 324 can be emitted to the outside. The light passing through the third transflective electrode 324 and the first transparent electrode 323 can be distributed into second reflective light L2 and transmissive light L3 by the second transflective electrode 322. The second reflective light L2 can be emitted to the outside after being reflected on the second transflective electrode 322, and the transmissive light L3 can be absorbed into the light-absorbing layer 321 by passing through the second transflective electrode 322.

In this situation, partial destructive interference can occur between the first reflective light L1 and the second reflective light L2, which are emitted to the outside, thus canceling portions of each other out and reducing the amount reflected light experienced by a user. For example, when the first reflective light L1 and the second reflective light L2 are the same as each other in the amount of light, the first reflective light L1 and the second reflective light L2 can be all offset due to destructive interference. However, since the amount of light of the second reflective light L2 is less than that of the first reflective light L1 by the transmissive light L3 absorbed by the light-absorbing layer 321, the first reflective light L1 and the second reflective light L2 may not all be offset but be partially offset. Since the reflective light that is not offset may be used when the pixel is displayed together with the light emitted from the light-emitting layer 500, reflectance of the external light can be reduced, and reduction in luminance can be minimized.

Therefore, according to the first embodiment of the present disclosure, the first transparent electrode 323 is formed between the second and third transflective electrodes 322 and 324 formed to be thinner than the first transflective electrode 312 of the first subpixel P1 to have transmittance more improved than that of the first transflective electrode 312 of the first subpixel P1, whereby the first electrode 320 of the second subpixel P2 can more reduce reflectance of the external light with respect to all wavelengths than the first electrode 310 of the first subpixel P1. In particular, the first electrode 320 of the second subpixel P2 can reduce reflectance of a wavelength band of green (G) light that is the light having the greatest effect on visibility of a panel. For example, the first electrode 320 of the second subpixel P2 can effectively reduce reflectance of light at a specific wavelength band of 550 nm.

The second transflective electrode 322 and the third transflective electrode 324 can be made of their respective materials different from each other. Materials having similar reflectance can be used as the second transflective electrode 322 and the third transflective electrode 324, whereby a spectrum of reflectance for each wavelength band of the light can be precisely set and controlled.

Also, the first, second and third transflective electrodes 312, 322 and 324 can be made of the same material. In particular, the second transflective electrode 322 can be formed to be thicker than the third transparent electrode 324 to reduce light reflectance of the wavelength band of the green (G) light which is the light having the greatest effect on visibility of a panel. For example, in order to further reduce reflectance of the light at a wavelength band of 550 nm, the second transflective electrode 322 can be formed to be thicker than the third transflective electrode 324.

For simplification of a process, the first transflective electrode 312 can be formed to have the same thickness as a sum of the thickness of the second transflective electrode 322 and the thickness of the third transflective electrode 324. In detail, simultaneously with the process of forming the second transflective electrode 322, a lower area of the first transflective electrode 312 can be formed. Afterwards, the first transparent electrode 323 can be formed on the second transflective electrode 322. Simultaneously with the process of forming the third transflective electrode 324 on the first transparent electrode 323, an upper area of the first transflective electrode 312 can be formed. That is, simultaneously with the process of forming the second transflective electrode 322 and the third transflective electrode 324, the first transflective electrode 312 can be formed, whereby additional process of forming the first transflective electrode 312 can be omitted. Therefore, the first transflective electrode 312 can be formed of a double layer, and can be formed at the same thickness as the sum of the thickness of the second transflective electrode 322 and the thickness of the third transflective electrode 324. In addition, when the first to third transflective electrodes 312, 322 and 324 are made of the same material, the first transflective electrode 312 can be viewed as a single uniform layer (e.g., see the dotted line in FIG. 2 part (a)).

Figure 3:
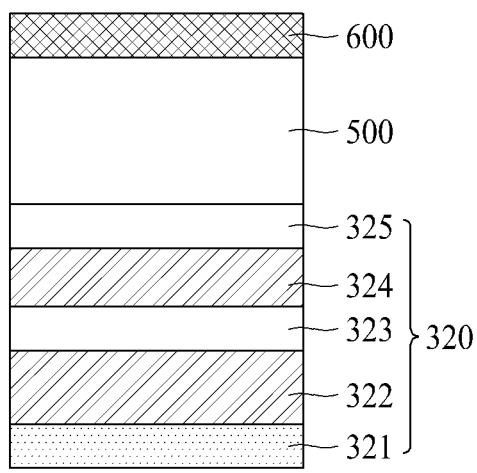
FIG. 3, including parts (a), (b), (c) and (d), shows schematic cross-sectional views illustrating another example of a light emission area of an individual subpixel of a display apparatus according to an embodiment of the present disclosure.
Figure 3:
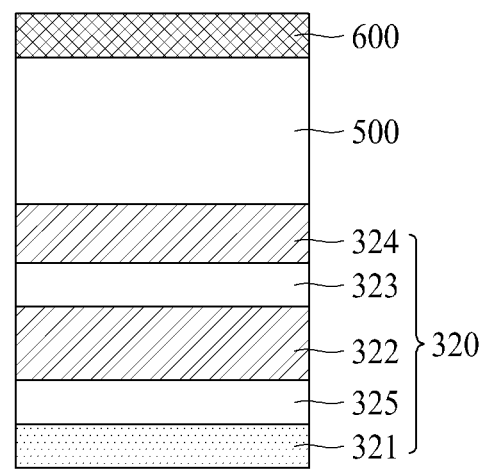
Figure 3:
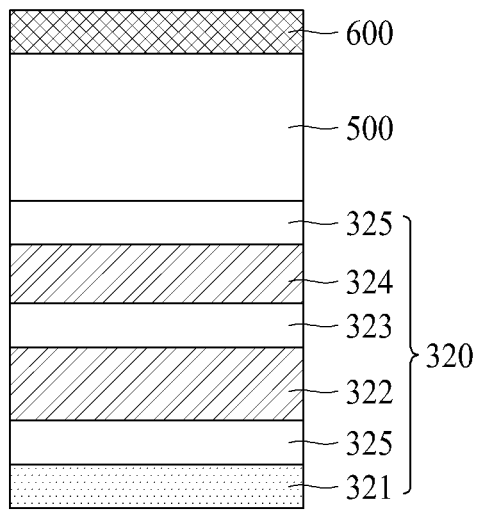
Figure 3:
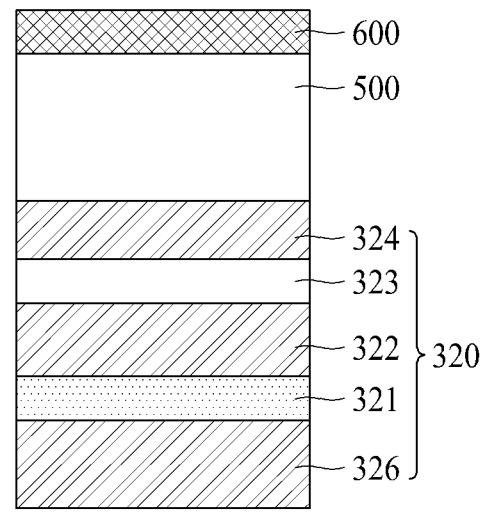

As shown in FIG. 3 part (a), the first electrode 320 provided in the second subpixel P2 can further include a second transparent electrode 325. Referring to FIG. 3 part (a), the second transparent electrode 325 can be provided between the third transflective electrode 324 and the light-emitting layer 500 to reduce a difference between a work function of the third transflective electrode 324 and a work function of the light-emitting layer 500.

Referring to FIG. 3 part (b), the second transparent electrode 325 can be provided between the light-absorbing layer 321 and the second transflective electrode 322 to improve adhesion between the light-absorbing layer 321 and the second transflective electrode 322. The second transparent electrode 325 can be formed of the same material as that of the first transparent electrode 323.

Otherwise, referring to FIG. 3 part (c), the second transparent electrode 325 can be provided between the third transflective electrode 324 and the light-emitting layer 500 and between the light-absorbing layer 321 and the second transflective electrode 322. Therefore, the difference between the work function of the third transflective electrode 324 and the work function of the light-emitting layer 500 can be reduced, and adhesion between the light-absorbing layer 321 and the second transflective electrode 322 can be improved. The plurality of second transparent electrodes 325 can be formed of the same material as that of the first transparent electrode 323.

Otherwise, referring to FIG. 3 part (d), a reflective electrode 326 can be provided below the light-absorbing layer 321. The reflective electrode 326 can reflect external light that is not absorbed by the light-absorbing layer 321 to change a light path so that the light can be absorbed by the light-absorbing layer 321. The reflective electrode 326 can be formed of the same material as that of the second and third transflective electrodes 322 and 324, and can be thicker than the second and third transflective electrodes 322 and 324. As the reflective electrode 326 is formed to be thicker than the second and third transflective electrodes 322 and 324, a thickness deviation between the second transflective electrode 322 and the third transflective electrode 324 can be reduced.

FIGS. 4A to 4F are schematic cross-sectional views illustrating first, second, third and fourth subpixels P1 to P4 of the display apparatus according to the first embodiment of the present disclosure.

Figure 4A:
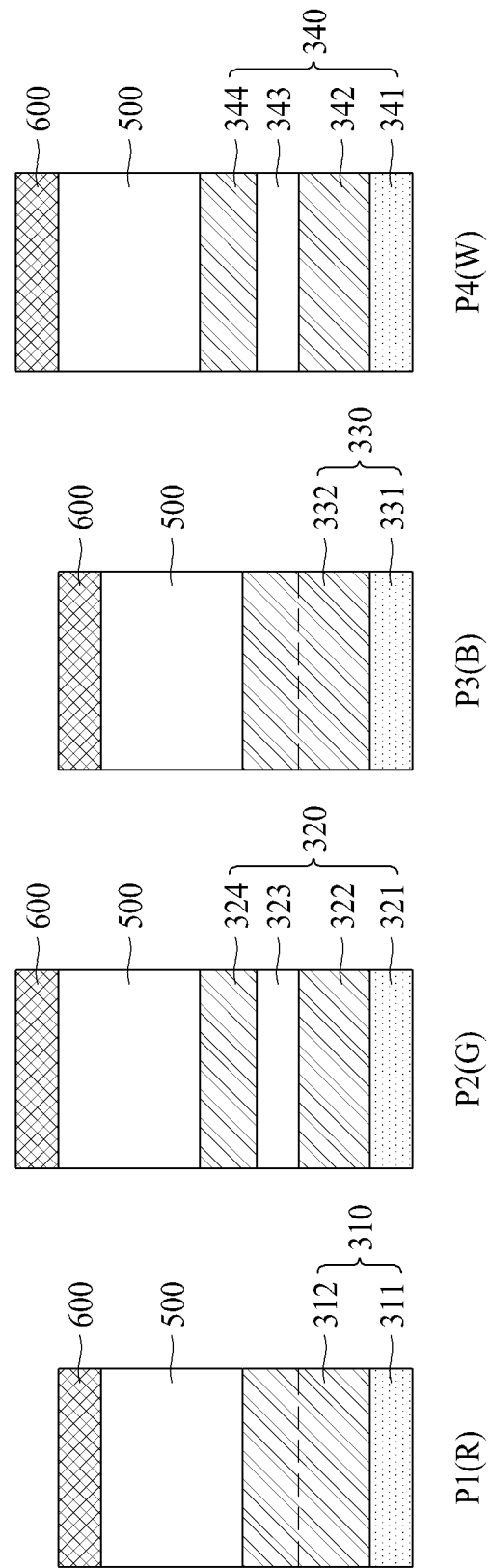
FIGS. 4A to 4I are schematic cross-sectional views illustrating another example of a light emission area of first, second, third and fourth subpixels of a display apparatus according to an embodiment of the present disclosure.

Referring to FIG. 4A, the first electrode 330 of the third subpixel P3 can have the same structure as that of the first electrode 310 of the first subpixel P1. That is, the first electrode 330 of the third subpixel P3 can include a light-absorbing layer 331 and a first transflective electrode 332. Therefore, reduction in light emission efficiency of the third subpixel P3 can be minimized, and the external light can be prevented from being reflected from the third subpixel P3. In addition, when the first electrode 310 of the first subpixel P1 does not include the light-absorbing layer 311, the first electrode 330 of the third subpixel P3 may not include the light-absorbing layer 331.

In addition, the first electrode 340 of the fourth subpixel P4 can have the same structure as that of the first electrode 320 of the second subpixel P2. That is, the first electrode 340 of the fourth subpixel P4 can include a light-absorbing layer 341, a second transflective electrode 342, a first transparent electrode 343 and a third transflective electrode 344. Therefore, the first electrode 340 of the fourth subpixel P4 can more reduce reflectance of light at the wavelength band of the green (G) light, e.g., the wavelength band of 500 nm, which is the light having the greatest effect on visibility of a panel.

Figure 4B:
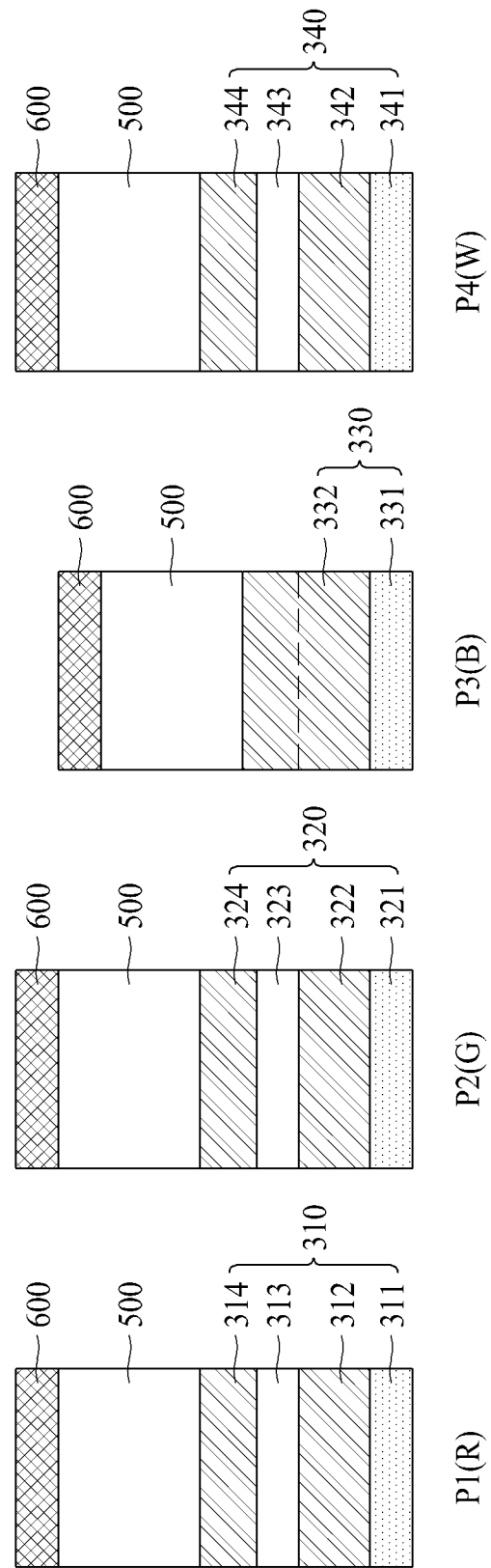

Referring to FIG. 4B, the first electrode 310 of the first subpixel P1 can have the same structure as that of each of the first electrodes 320 and 340 of the second subpixel P2 and the fourth subpixel P4. That is, the first electrode 310 of the first subpixel P1 can include a light-absorbing layer 311, a second transflective electrode 312, a first transparent electrode 313 and a third transflective electrode 314.

Figure 4C:
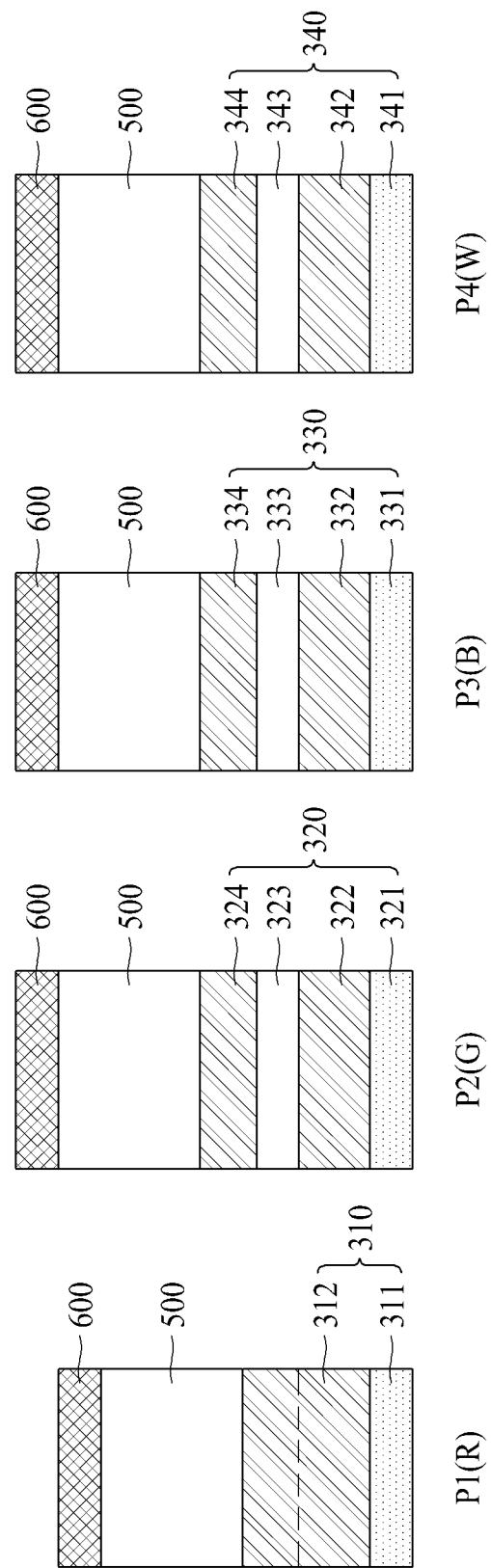

Referring to FIG. 4C, the first electrode 330 of the third subpixel P3 can have the same structure as that of each of the first electrodes 320 and 340 of the second subpixel P2 and the fourth subpixel P4. That is, the first electrode 330 of the third subpixel P3 can include a light-absorbing layer 331, a second transflective electrode 332, a first transparent electrode 333 and a third transflective electrode 334.

Figure 4D:
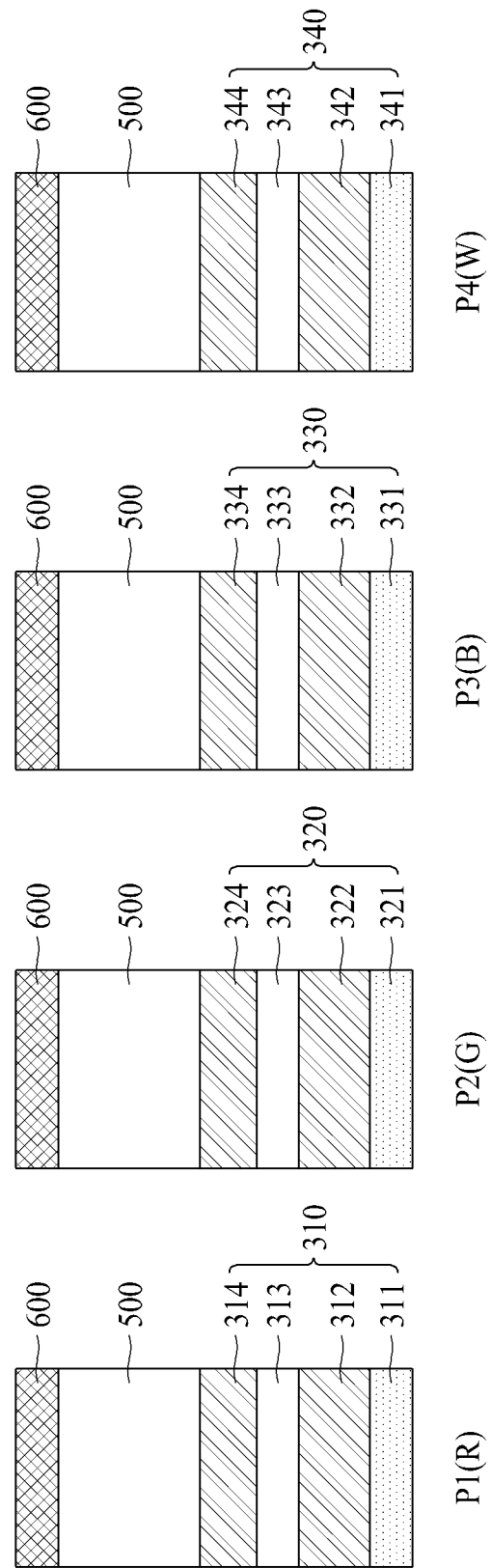

Referring to FIG. 4D, the first electrodes 310, 320, 330 and 340 of the first to fourth subpixels P1 to P4 can be formed in the same deposited structure. In this situation, in the process of forming the first electrodes 310, 320, 330 and 340 of the first, second, third and fourth subpixels P1 to P4, additional patterning process can be omitted, whereby the process may be simplified.

Figure 4E:
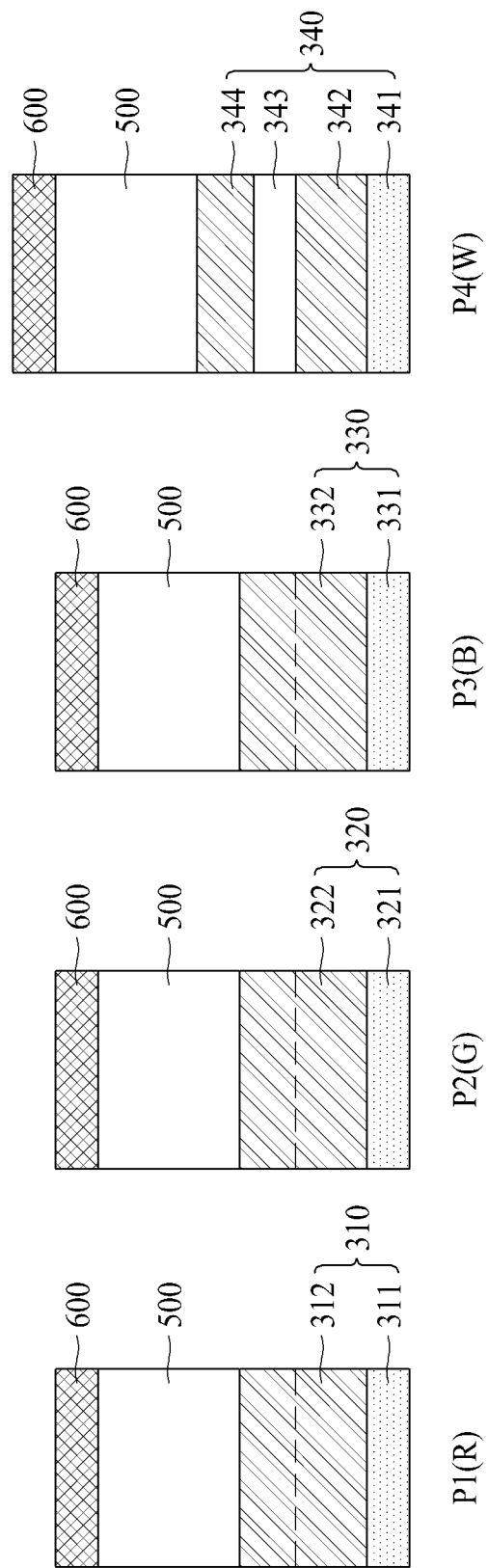

Referring to FIG. 4E, the first electrodes 310, 320 and 330 of the first to third subpixels P1 to P3 can have the same structure, and only the first electrodes 340 of the fourth subpixels P4 can have a different structure (e.g., only the white sub-pixel differs). That is, the first electrodes 310, 320 and 330 of the first to third subpixels P1 to P3 include light-absorbing layers 311, 321 and 331 and first transflective electrodes 312, 322 and 332, respectively, and the first electrode 340 of the fourth subpixel P4 can include a light-absorbing layer 341, a second transflective electrode 342, a first transparent electrode 343 and a third transflective electrode 344. At this time, in the first electrode 340 of the fourth subpixel P4 of FIG. 4E, the material and the thickness, which constitute each of the light-absorbing layer 341, the second transflective electrode 342, the first transparent electrode 343 and the third transflective electrode 344, can be adjusted to precisely set the spectrum of reflectance for each wavelength band of the light. In addition, the light-absorbing layers 311, 321, 331 and 341 of the first electrodes 310, 320, 330 and 340 of the first to fourth subpixels P1 to P4 may not be formed.

Figure 4F:
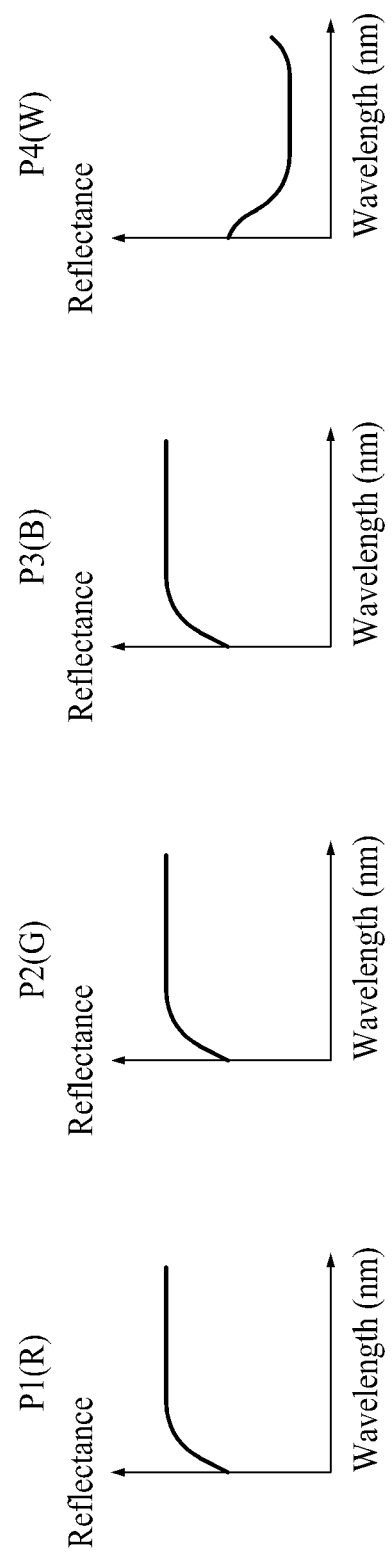

For example, referring to FIG. 4F, reflectance of all the wavelength bands of the first electrode 340 of the fourth subpixel P4 can be set to be lower than that of the first electrodes 310, 320 and 330 of the first to third subpixels P1 to P3. Therefore, reflectance of a white (W) pixel, which is most sensitive to visibility reflectance characteristic, can be reduced, whereby panel reflectance can be reduced.

Figure 4G:
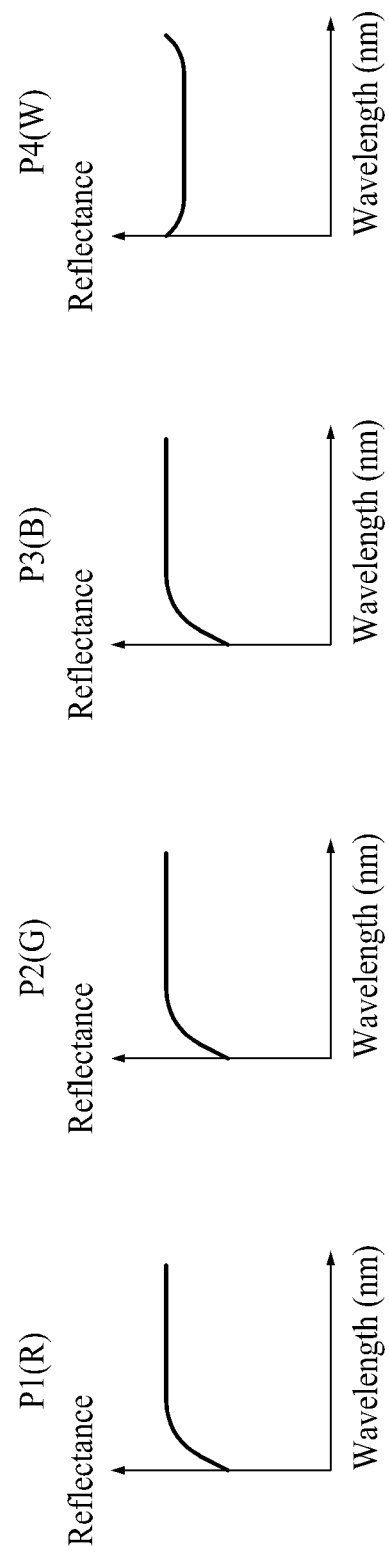

Otherwise, referring to FIG. 4G, light reflectance of a wavelength band of blue (B) light of the first electrode 340 of the fourth subpixel P4, that is, light reflectance of a wavelength band of 400 nm to 500 nm can be set to be higher than that of blue (B) light of the first electrodes 310, 320 and 330 of the first to third subpixels P1 to P3. Therefore, luminance of the blue (B) light can be improved to enhance a color temperature of the white (W) light.

Figure 4H:
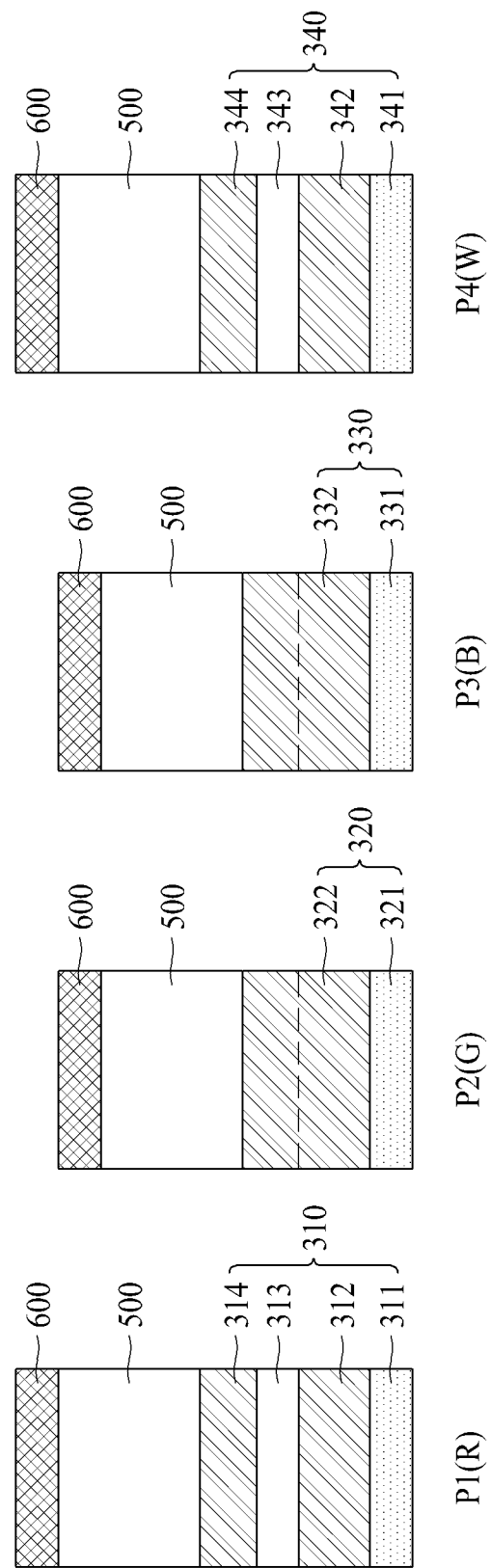

Referring to FIG. 4H, the first electrodes 310 and 340 of the first and fourth subpixels P1 and P4 can have the same structure. That is, the first electrodes 310 and 340 of the first and fourth subpixels P1 and P4 can include light-absorbing layers 311 and 341, second transflective electrodes 312 and 342, first transparent electrodes 313 and 343, and third transflective electrodes 314 and 344, respectively. At this time, the material and the thickness, which constitute each of the light-absorbing layer 311, the second transflective electrode 312, the first transparent electrode 313 and the third transflective electrode 314, can be adjusted to precisely set the spectrum of reflectance for each wavelength band of the light. In addition, the light-absorbing layers 311, 321, 331 and 341 of the first electrodes 310, 320, 330 and 340 of the first, second, third and fourth subpixels P1 to P4 may not be formed.

Figure 4I:
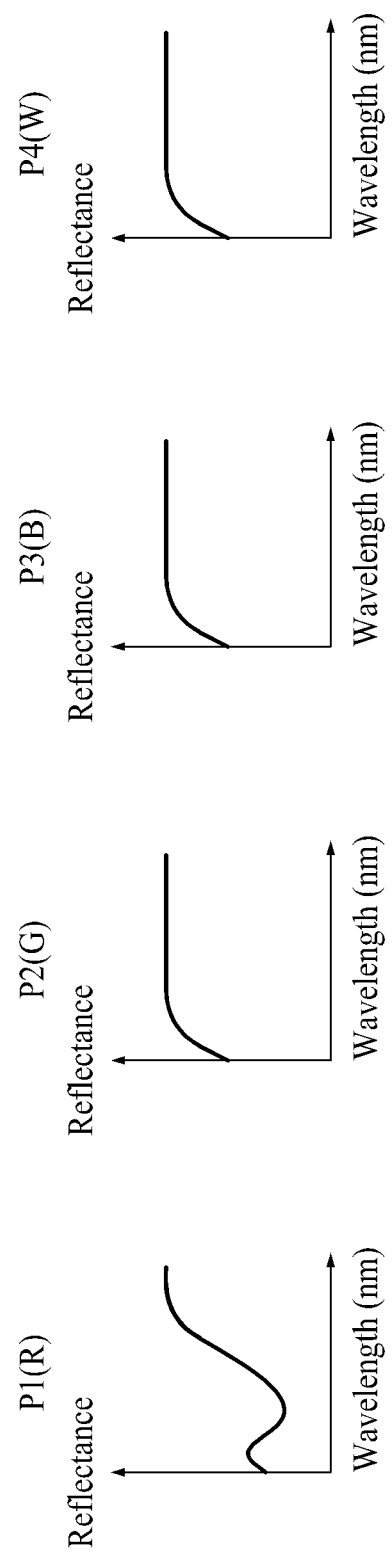

For example, referring to FIG. 4I, reflectance of a wavelength band of red (R) light of the first electrode 310 of the first subpixel P1 can be set to be higher than that of red (R) light of the first electrodes 320, 330 and 340 of the second, third and fourth subpixels P2 to P4. In addition, reflectance of the wavelength band of the green (G) light and blue (B) light of the first electrode 310 of the first subpixel P1 can be set to be lower than that of the green (G) light and blue (B) light of the first electrodes 320, 330 and 340 of the second, third and fourth subpixels P2 to P4. Therefore, a pure color of the red (R) light can be improved.

Referring to FIG. 1, the bank 400 is formed in a matrix structure on the first electrodes 310, 320, 330 and 340 at the boundary between the plurality of subpixels P1, P2, P3 and P4 and defines a light emission area in each of the plurality of subpixels P1, P2, P3 and P4. That is, an opening area where the bank 400 is not formed in each of the subpixels P1, P2, P3 and P4 becomes the light emission area.

The bank 400 can be formed of an organic layer, such as an acrylic resin, an epoxy resin, a phenolic resin, a polyamide resin and a polyimide resin. Alternatively, the bank 400 can be formed of an inorganic layer, such as silicon nitride, aluminum nitride, zirconium nitride, titanium nitride, hafnium nitride, tantalum nitride, silicon oxide, aluminum oxide or titanium oxide.

The light-emitting layer 500 is formed on the first electrodes 310, 320, 330 and 340. The light-emitting layer 500 can also be formed on the bank 400. That is, the light-emitting layer 500 is also formed at boundary areas among the subpixels P1, P2, P3 and P4.

The light-emitting layer 500 can include a hole transporting layer, a light-emitting layer and an electron transporting layer. In this situation, when a voltage is applied to the first electrodes 310, 320, 330 and 340 and the second electrode 600, holes and electrons move to the light-emitting layer through the hole transporting layer and the electron transporting layer, respectively, and are combined with each other in the light-emitting layer to emit light.

The light-emitting layer 500 can be provided to emit white (W) light. To this end, the light-emitting layer 500 can include a plurality of stacks that emit light of different colors. In addition, when the light-emitting layer 500 is configured to emit white W, the light-emitting layer 500 can be formed of the same material at the same thickness for each of the subpixels P1, P2, P3 and P4.

The second electrode 600 is formed on the light-emitting layer 500. The second electrode 600 can serve as a cathode of the display apparatus. In the same manner as the light-emitting layer 500, the second electrode 600 is formed in each of the subpixels P1, P2, P3 and P4 and the boundary areas among them. That is, the second electrode 600 can be formed above the first electrodes 310, 320, 330 and 340 and above the bank 400.

Since the display apparatus according to the first embodiment of the present disclosure is comprised of a top emission scheme, the second electrode 600 can be made of a transparent metal material, such as indium tin oxide (ITO) or indium zinc oxide (IZO), in order to transmit the light emitted from the light-emitting layer 500 to the upper portion. The second electrode 600 can be comprised of a single layer or multi-layer.

The encapsulation layer 700 is formed on the second electrode 600 to prevent external moisture from being permeated into the light-emitting layer 500. The encapsulation layer 700 can be formed of an inorganic insulating material. Alternatively, the encapsulation layer 700 can have a structure in which a plurality of inorganic insulating materials and at least one organic insulating materials are deposited, but is not limited thereto. For example, the encapsulation layer 700 can be formed such that the first inorganic insulating material and the second inorganic insulating material can overlap each other with the organic insulating material interposed therebetween (e.g., triple layered).

The light-shielding layer 800 is formed on the encapsulation layer 700. The light-shielding layer 800 is formed in a matrix structure at the boundary among the plurality of subpixels P1, P2, P3 and P4 to prevent light leakage from occurring at the boundary among the subpixels P1, P2, P3 and P4.

The color filters 910, 920 and 930 are formed on the light-shielding layer 800 and the encapsulation layer 700. Although the color filters 910, 920 and 930 are shown as being formed on the light-shielding layer 800, the light-shielding layer 800 can be formed on the color filters 910, 920 and 930.

The color filters 910, 920 and 930 include a first color filter 910 of red (R) provided in the first subpixel P1, a second color filter 920 of green (G) provided in the second subpixel P2 and a third color filter 930 of a blue (B) provided in the third subpixel P3. Therefore, in the first subpixel P1, the white (W) light emitted from the light-emitting layer 500 passes through the first color filter 910 of red (R) to transmit only the red (R) light. In the second subpixel P2, the white (W) light emitted from the light-emitting layer 500 passes through the second color filter 920 of green (G) to transmit only the green light (G). In the third subpixel P3, the white (W) light emitted from the light-emitting layer 500 passes through the third color filter 930 of blue (B) to transmit only the blue (B) light. Since the fourth subpixel P4 is not provided with a color filter, the white (W) light emitted from the light-emitting layer 500 is emitted unfiltered from the fourth subpixel P4 as it is.

In addition, a protective film can additionally be provided on the color filters 910, 920 and 930.

According to the embodiment of the present disclosure, the first electrodes 310, 320, 330 and 340 respectively provided in the subpixels P1, P2, P3 and P4 are formed to have their respective structures different from each other in the top emission type display apparatus, whereby reflectance of the external light can be reduced to improve visibility of the panel (e.g., subpixels the P1, P2, P3 and P4 can have different structures in order to disperse reflected light in different manners and directions, and reduce the effect of reflected external light on a viewer).

Figure 5:
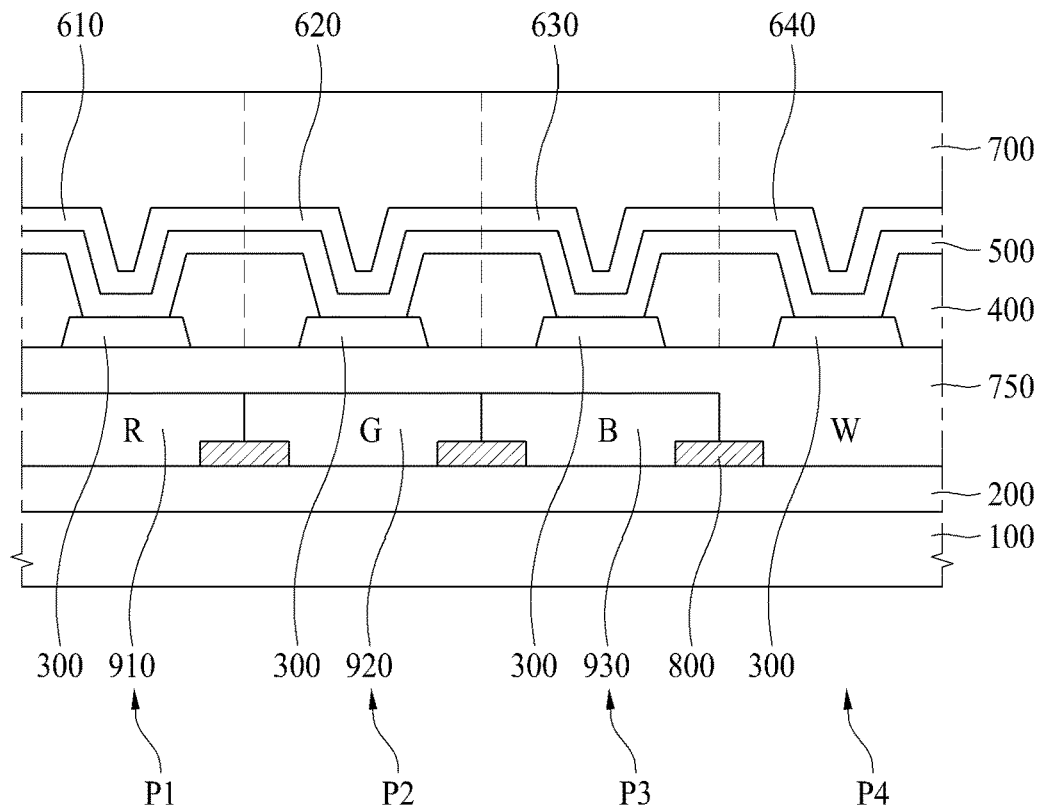
FIG. 5 is a schematic cross-sectional view illustrating a display apparatus according to another embodiment of the present disclosure.
Figure 6:
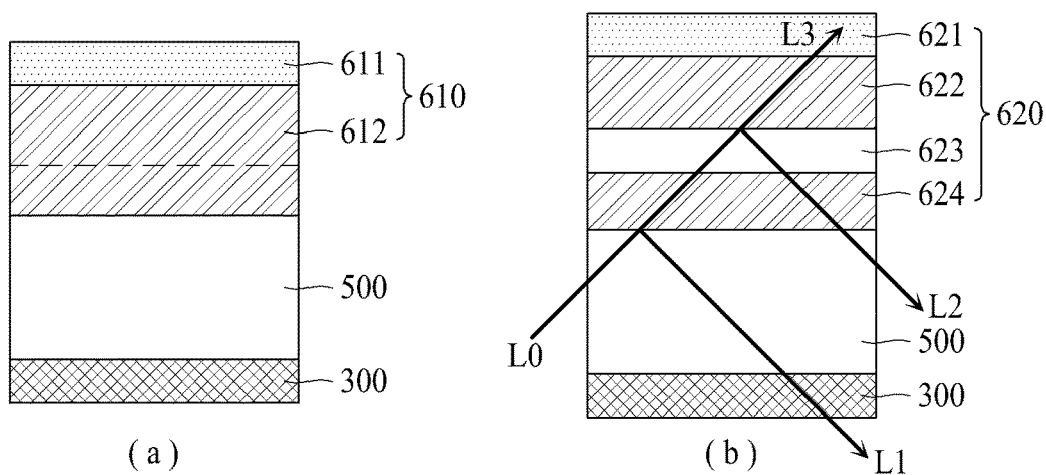
FIG. 6, including parts (a) and (b), shows schematic cross-sectional views illustrating a light emission area of an individual subpixel of a display apparatus according to an embodiment of the present disclosure.

FIG. 5 is a schematic cross-sectional view illustrating a display apparatus according to a second embodiment of the present disclosure, and FIG. 6 parts (a) and (b) are schematic cross-sectional views illustrating a light emission area of an individual subpixel of a display apparatus according to the second embodiment of the present disclosure. The display apparatus according to the second embodiment is modified from the display apparatus according to FIGS. 1, 2 parts (a) and (b) in the positions of the color filters 910, 920 and 930 and the structures of the first electrodes 310, 320, 330 and 340 and the second electrode 600.

Since the display apparatus according to the second embodiment of the present disclosure is comprised of a bottom emission scheme in which the emitted light is emitted to a lower portion, the substrate 100 can be made of a transparent material.

Also, the color filters 910, 920 and 930 are formed on the circuit element layer 200. The color filters 910, 920 and 930 are shown as being formed on the light-shielding layer 800, but are not limited thereto, and the light-shielding layer 800 can be formed on the color filters 910, 920 and 930.

Referring to FIG. 5, a planarization layer 750 covering the light-shielding layer 800 and the color filters 910, 920 and 930 can be formed to compensate for a step difference between the light-shielding layer 800 and the color filters 910, 920 and 930 and the circuit element layer 200. The planarization layer 750 can be made of an inorganic insulating material, but is not limited thereto.

In addition, the first electrode 300 is formed on the circuit element layer 200. The first electrode 300 is formed to be patterned for each of the subpixels P1, P2, P3 and P4, and can function as an anode of the display apparatus. The first electrode 300 is connected with the driving thin film transistor provided in the circuit element layer 200. Since the display apparatus according to the second embodiment of the present disclosure is comprised of a bottom emission scheme, the first electrode 300 can be made of a transparent conductive material, such as indium tin oxide (ITO) or indium zinc oxide (IZO) to transmit light emitted from the light-emitting layer 500 toward the lower portion. The first electrode 300 can be comprised of a single layer or a multi-layer.

Referring to FIG. 6 parts (a) and (b), second electrodes 610, 620, 630 and 640 respectively provided in the first, second, third and fourth subpixels P1 to P4 can have their respective structures different from one another to reduce reflectance of light incident from the outside of the display apparatus.

In detail, FIG. 6 part (a) illustrates the structure of the second electrode 610 provided in the first subpixel P1. The second electrode 610 included in the first subpixel P1 includes a light-absorbing layer 611 and a first transflective electrode 612.

The light-absorbing layer 611 of the first subpixel P1 is provided below the encapsulation layer 700. The light-absorbing layer 611 can be made of a material, which absorbs light, to absorb external light incident on the first subpixel P1. For example, the light-absorbing layer 611 can be made of a metal material, such as chromium (Cr) or nickel (Ni). Alternatively, the light-absorbing layer 611 can be formed of an organic material or an inorganic material, which includes a black dye.

The first transflective electrode 612 of the first subpixel P1 is provided between the light-absorbing layer 611 and the light-emitting layer 500. The first transflective electrode 612 can reflect a portion of the light and allow another portion of the light to pass through or transmit through the first transflective electrode 612. Therefore, the light reflected from the first transflective electrode 612 can pass through a color filter to display the first subpixel P1. The light transmitted through the first transflective electrode 612 can enter the light-absorbing layer 611 provided above the first transflective electrode 612, and thus can be absorbed into the light-absorbing layer 611. Therefore, the external light can be prevented from being reflected from the first subpixel P1. Also, reduction in light emission efficiency of the first subpixel P1 can be minimized. The first transflective electrode 612 can be comprised of a single layer or a multi-layer, which is made of a metal material, such as aluminum (Al), silver (Ag), copper (Cu), magnesium (Mg), molybdenum (Mo) and titanium (Ti), or their alloy.

In addition, the light-absorbing layer 611 can be omitted from the first subpixel P1.

FIG. 6 part (b) illustrates the structure of the second electrode 620 provided in the second subpixel P2. The second electrode 620 provided in the second subpixel P2 includes a light-absorbing layer 621, a second transflective electrode 622, a transparent electrode 623 and a third transflective electrode 624.

The light-absorbing layer 621 of the second subpixel P2 is provided below the encapsulation layer 700. The light-absorbing layer 621 can be made of a material, which absorbs external light, to absorb external light incident on the second subpixel P2. For example, the light-absorbing layer 621 can be made of a metal material, such as chromium (Cr) or nickel (Ni). Alternatively, the light-absorbing layer 621 can be formed of an organic material or an inorganic material, which includes a black dye. In addition, the light-absorbing layer 621 provided in the second subpixel P2 can be formed to have the same thickness as that of the light-absorbing layer 611 provided in the first subpixel P1.

The second transflective electrode 622 of the second subpixel P2 is provided below the light-absorbing layer 621. The second transflective electrode 622 can reflect a portion of the light and transmit the other portion of the light. Therefore, the light transmitted from the second transflective electrode 622 can enter the light-absorbing layer 621 provided above the second transflective electrode 622, and then can be absorbed into the light-absorbing layer 621. At this time, the second transflective electrode 622 can be formed to be thinner than the first transflective electrode 612 to further improve transmittance of the light, thereby increasing the amount of the light absorbed into the light-absorbing layer 621. The second transflective electrode 622 can be comprised of a single layer or a multi-layer, which is made of a metal material, such as aluminum (Al), silver (Ag), copper (Cu), magnesium (Mg), molybdenum (Mo) and titanium (Ti), or their alloy.

The transparent electrode 623 of the second subpixel P2 is provided below the second transflective electrode 622, and can be made of a transparent conductive material. For example, the first transparent electrode 623 can be formed of a single layer or a multi-layer of a transparent conductive material, such as indium tin oxide (ITO) and indium zinc oxide (IZO).

The third transflective electrode 624 of the second subpixel P2 is provided between the transparent electrode 623 and the light-emitting layer 500. The third transflective electrode 624 can reflect a portion of the light and allow another portion of the light to pass through or transmit through the third transflective electrode 624. At this time, the third transflective electrode 624 can be formed to be thinner than the first transflective electrode 612, thereby further improving transmittance of the light. Further, the third transflective electrode 624 can be comprised of a single layer or a multi-layer, which is made of a metal material, such as aluminum (Al), silver (Ag), copper (Cu), magnesium (Mg), molybdenum (Mo) and titanium (Ti), or their alloy.

That is, the second subpixel P2 is provided between the circuit element layer 200 and the light-emitting layer 500, and can include a second electrode 620 having a structure in which the third transflective electrode 624, the transparent electrode 623, the second transflective electrode 622 and the light-absorbing layer 621 are sequentially stacked on each other. Through the stacked structure, the second subpixel P2 can reduce reflectance of the external light more effectively than the first subpixel P1. In detail, when external light L0 enters the light emission area, the external light L0 can be distributed into light reflected on the third transflective electrode 624 and light passing through the third transflective electrode 624. First reflective light L1 reflected on the third transflective electrode 624 can be emitted to the outside. The light passing through the third transflective electrode 624 and the transparent electrode 623 can be distributed into second reflective light L2 and transmissive light L3 by the second transflective electrode 622. The second reflective light L2 can be emitted to the outside after being reflected on the second transflective electrode 622, and the transmissive light L3 can be absorbed into the light-absorbing layer 621 by passing through the second transflective electrode 622.

In this situation, partial destructive interference can occur between the first reflective light L1 and the second reflective light L2, which are emitted to the outside. For example, when the first reflective light L1 and the second reflective light L2 are the same as each other in the amount of light, the first reflective light L1 and the second reflective light L2 can all be offset. However, since the amount of light of the second reflective light L2 is less than that of the first reflective light L1 by the transmissive light L3 absorbed by the light-absorbing layer 621, the first reflective light L1 and the second reflective light L2 may not be entirely offset but be partially offset. Since the reflective light that is not offset can be used when the pixel is displayed together with the light emitted from the light-emitting layer 500, reflectance of the external light can be reduced, and reduction in luminance can be minimized.

Therefore, according to the second embodiment of the present disclosure, the transparent electrode 623 is formed between the second and third transflective electrodes 622 and 624 formed to be thinner than the first transflective electrode 612 of the first subpixel P1 to have transmittance more improved than that of the first transflective electrode 612 of the first subpixel P1, whereby the second electrode 620 of the second subpixel P2 can more reduce reflectance of the external light with respect to all wavelengths than the second electrode 610 of the first subpixel P1. In particular, the second electrode 620 of the second subpixel P2 can reduce reflectance of a wavelength band of green (G) light that is the light having the greatest effect on visibility of a panel. For example, the second electrode 620 of the second subpixel P2 can further reduce reflectance of light at a specific wavelength band of 550 nm or approximately 550 nm.

The second transflective electrode 622 and the third transflective electrode 624 can be made of their respective materials different from each other. Materials having similar reflectance can be used as the second transflective electrode 622 and the third transflective electrode 624, whereby a spectrum of reflectance for each wavelength band of the light can be precisely set and controlled.

Also, the first, second and third transflective electrodes 612, 622 and 624 can be made of the same material. In particular, the second transflective electrode 622 can be formed to be thicker than the third transparent electrode 624 to reduce light reflectance of the wavelength band of the green (G) light which is the light having the greatest effect on visibility of a panel. For example, in order to further reduce reflectance of the light at a wavelength band of 550 nm, the second transflective electrode 622 can be formed to be thicker than the third transflective electrode 624.

For simplification of a process, the first transflective electrode 612 can be formed to have the same thickness as a sum of the thickness of the second transflective electrode 622 and the thickness of the third transflective electrode 624. In detail, simultaneously with the process of forming the third transflective electrode 624, a lower area of the first transflective electrode 612 can be formed. Afterwards, the transparent electrode 623 can be formed on the third transflective electrode 622. Simultaneously with the process of forming the second transflective electrode 622 on the transparent electrode 623, an upper area of the first transflective electrode 612 can be formed. That is, simultaneously with the process of forming the second transflective electrode 622 and the third transflective electrode 624, the first transflective electrode 612 can be formed, whereby additional process of forming the first transflective electrode 612 can be omitted. Therefore, the first transflective electrode 612 can be formed of a double layer (e.g., see the dotted line in FIG. 6 part (a)), and can be formed at the same thickness as the sum of the thickness of the second transflective electrode 622 and the thickness of the third transflective electrode 624. In addition, when the first to third transflective electrodes 612, 622 and 624 are made of the same material, the first transflective electrode 612 can be viewed as a single layer.

Figure 7:
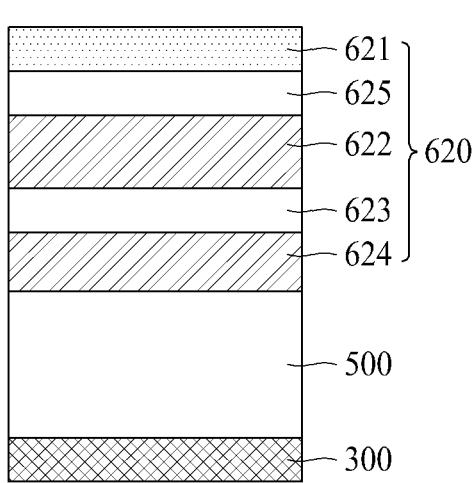
FIG. 7, including parts (a) and (b), shows schematic cross-sectional views illustrating another example of a light emission area of an individual subpixel of a display apparatus according to an embodiment of the present disclosure.
Figure 7:
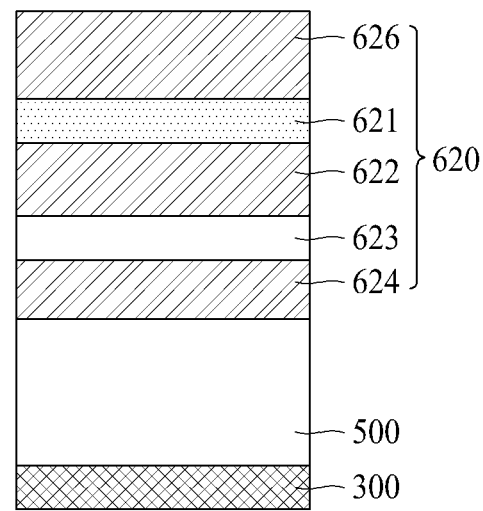

As shown in FIG. 7 part (a), the second electrode 620 provided in the second subpixel P2 can further include a filling layer 625. Referring to FIG. 7 part (a), the filling layer 625 can be provided between the light-emitting layer 621 and the second transflective electrode 622 to improve adhesion between the light-absorbing layer 621 and the second transflective electrode 622.

Otherwise, referring to FIG. 7 part (b), a reflective electrode 626 can be provided above the light-absorbing layer 621. The reflective electrode 626 can reflect external light that is not absorbed by the light-absorbing layer 621 to change a light path so that the light can be absorbed by the light-absorbing layer 621. The reflective electrode 626 can be formed of the same material as that of the second and third transflective electrodes 622 and 624, and can be thicker than the second and third transflective electrodes 622 and 624. As the reflective electrode 626 is formed to be thicker than the second and third transflective electrodes 622 and 624, a thickness deviation between the second transflective electrode 622 and the third transflective electrode 624 can be reduced.

FIGS. 8A to 8F are schematic cross-sectional views illustrating first, second, third and fourth subpixels P1 to P4 of the display apparatus according to the second embodiment of the present disclosure.

Figure 8A:
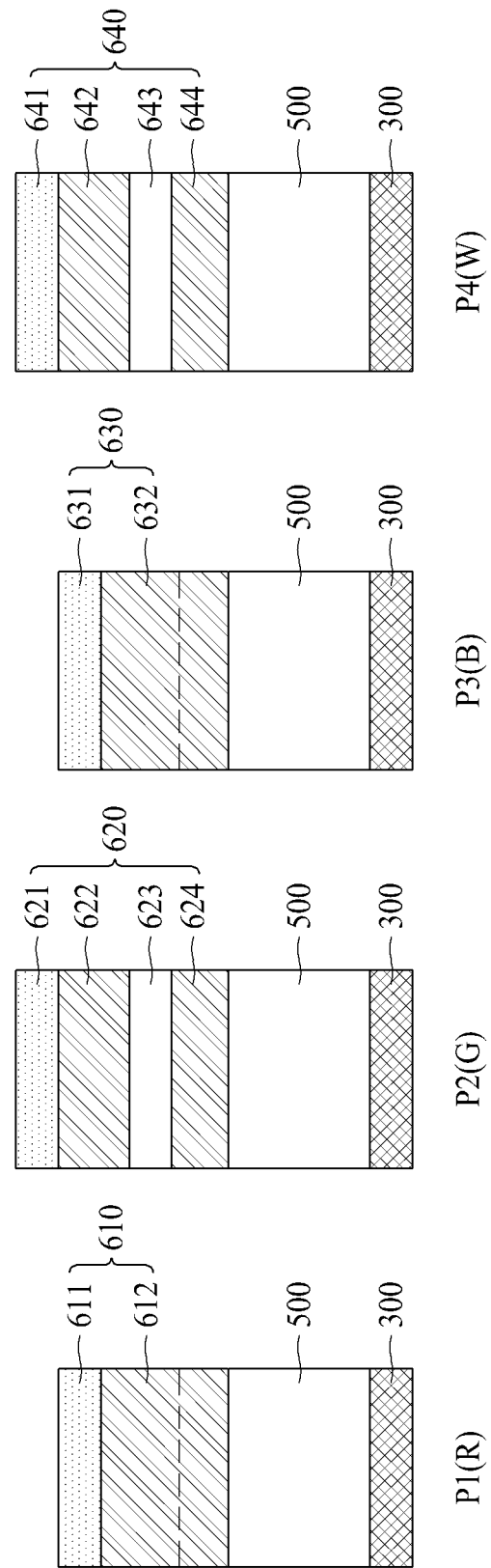

Referring to FIG. 8A, the second electrode 630 of the third subpixel P3 can have the same structure as that of the second electrode 610 of the first subpixel P1. That is, the second electrode 630 of the third subpixel P3 can include a light-absorbing layer 631 and a first transflective electrode 632. Therefore, reduction in light emission efficiency of the third subpixel P3 can be minimized, and the external light can be prevented from being reflected from the third subpixel P3. In addition, when the second electrode 610 of the first subpixel P1 does not include the light-absorbing layer 611, the first electrode 630 of the third subpixel P3 may not include the light-absorbing layer 631.

In addition, the second electrode 640 of the fourth subpixel P4 can have the same structure as that of the first electrode 620 of the second subpixel P2. That is, the first electrode 640 of the fourth subpixel P4 can include a light-absorbing layer 641, a second transflective electrode 642, a transparent electrode 643 and a third transflective electrode 644. Therefore, the first electrode 640 of the fourth subpixel P4 can more reduce reflectance of light at the wavelength band of the green (G) light, e.g., the wavelength band of 500 nm, which is the light having the greatest effect on visibility of a panel.

Referring to FIG. 8B, the second electrode 610 of the first subpixel P1 can have the same structure as that of each of the second electrodes 620 and 640 of the second subpixel P2 and the fourth subpixel P4. That is, the second electrode 610 of the first subpixel P1 can include a light-absorbing layer 611, a second transflective electrode 612, a transparent electrode 613 and a third transflective electrode 614.

Figure 8C:
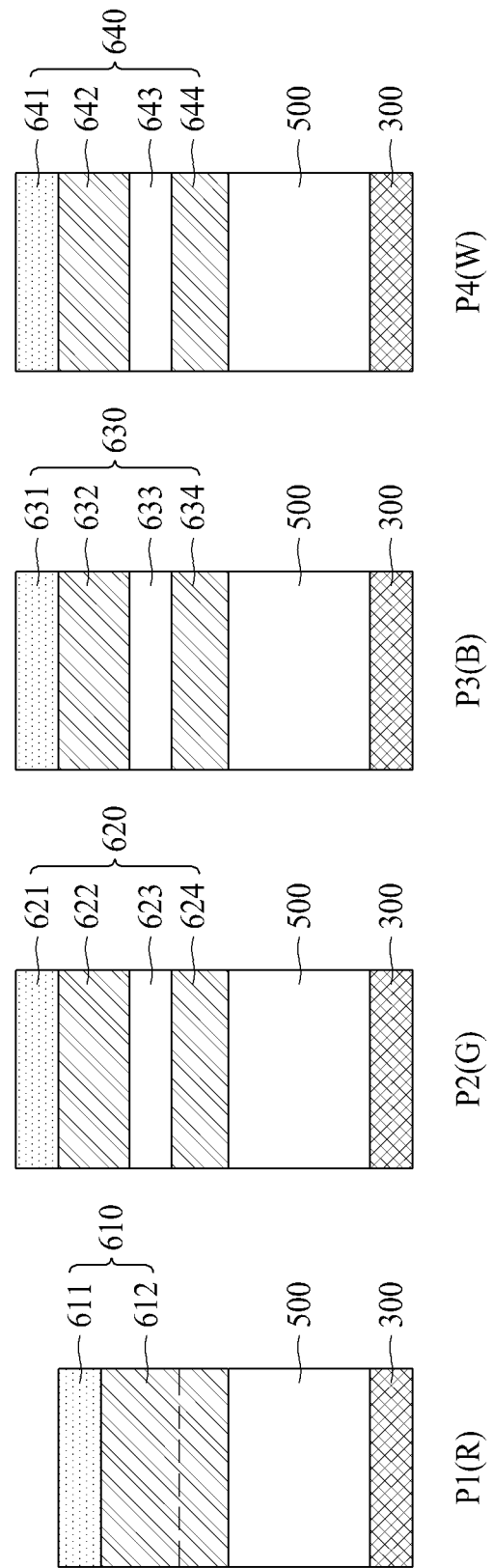

Referring to FIG. 8C, the second electrode 630 of the third subpixel P3 can have the same structure as that of each of the second electrodes 620 and 640 of the second subpixel P2 and the fourth subpixel P4. That is, the second electrode 630 of the third subpixel P3 can include a light-absorbing layer 631, a second transflective electrode 632, a transparent electrode 633 and a third transflective electrode 634.

Figure 8D:
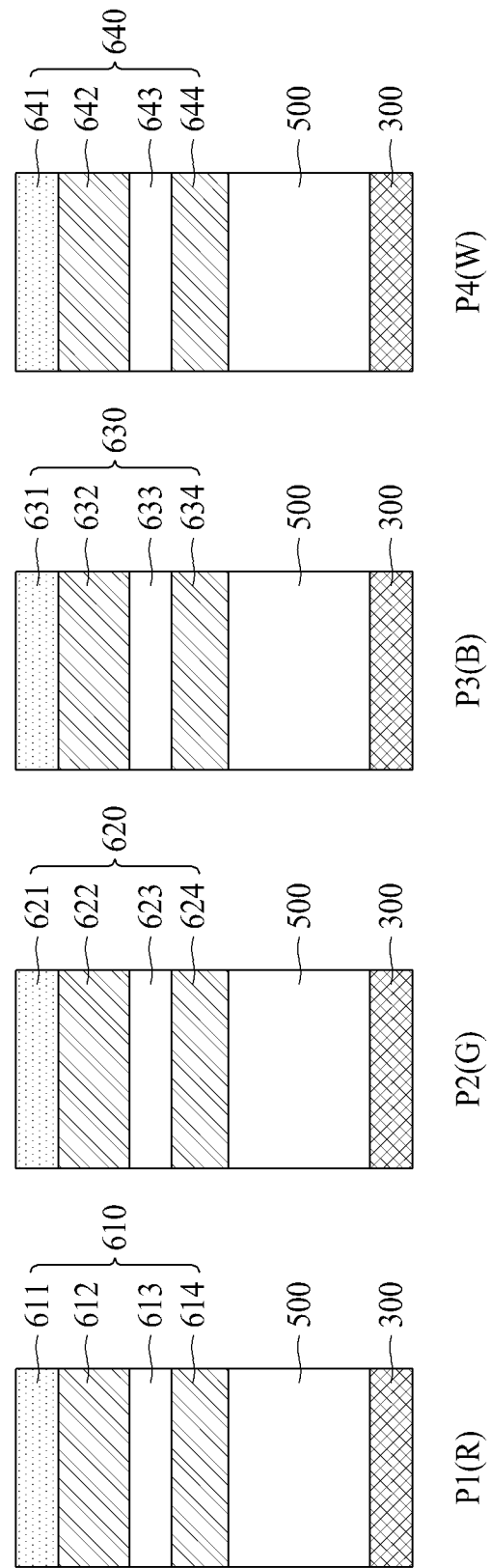

Referring to FIG. 8D, the second electrodes 610, 620, 630 and 640 of the first to fourth subpixels P1 to P4 can be formed in the same stacked structure. In this situation, in the process of forming the second electrodes 610, 620, 630 and 640 of the first, second, third and fourth subpixels P1 to P4, additional patterning process can be omitted, whereby the process can be simplified.

Figure 8E:
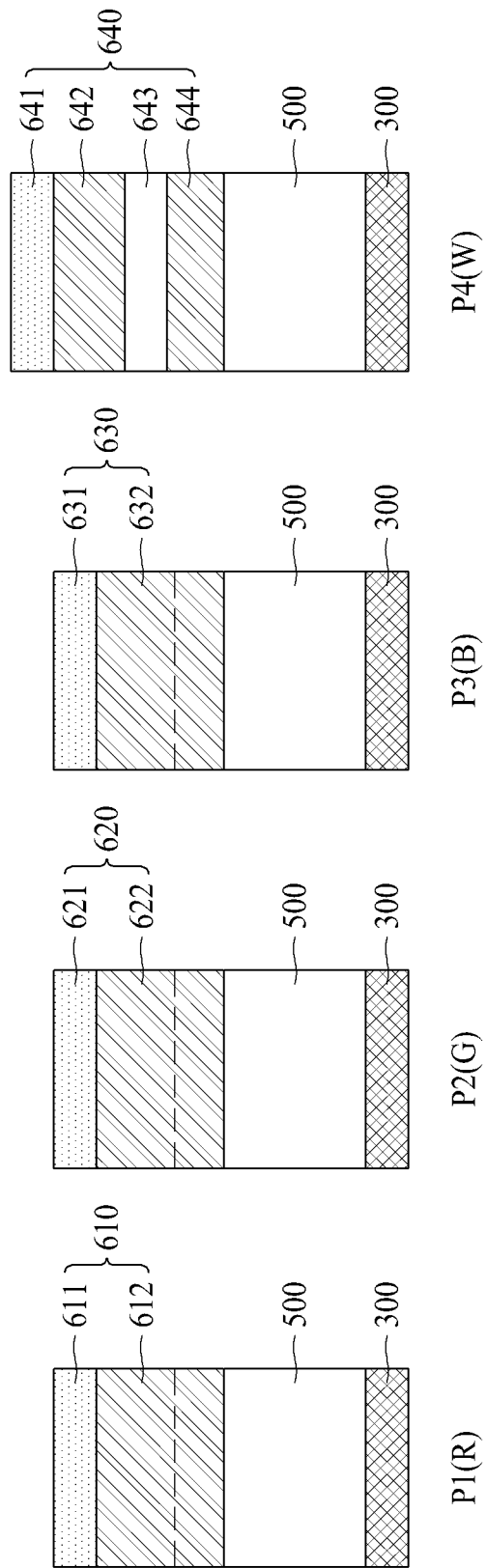

Referring to FIG. 8E, the second electrodes 610, 620 and 630 of the first, second and third subpixels P1 to P3 can have the same structure, and only the second electrodes 640 of the fourth subpixels P4 (e.g., the white subpixels) can have a different structure. That is, the second electrodes 610, 620 and 630 of the first, second and third subpixels P1 to P3 include light-absorbing layers 611, 621 and 631, and first transflective electrodes 612, 622 and 632, respectively, and the second electrode 640 of the fourth subpixel P4 can include a light-absorbing layer 641, a second transflective electrode 642, a transparent electrode 643 and a third transflective electrode 644. At this time, in the second electrode 640 of the fourth subpixel P4 of FIG. 8E, the material and the thickness, which constitute each of the light-absorbing layer 641, the second transflective electrode 642, the transparent electrode 643 and the third transflective electrode 644, can be adjusted to precisely set the spectrum of reflectance for each wavelength band of the light. In addition, the light-absorbing layers 611, 621, 631 and 641 of the second electrodes 610, 620, 630 and 640 of the first, second, third and fourth subpixels P1 to P4 may not be formed.

Figure 8F:
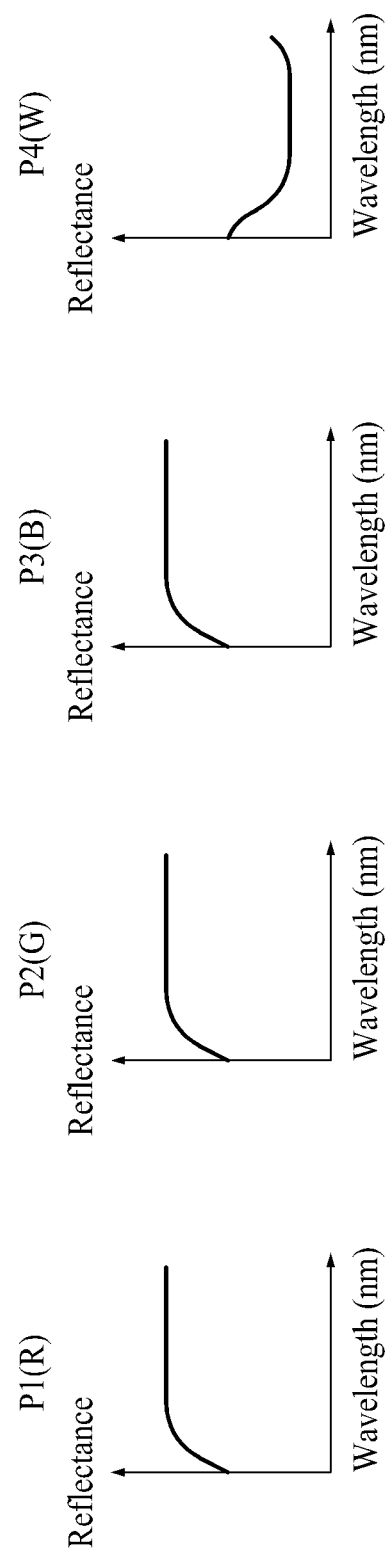

For example, referring to FIG. 8F, reflectance of all the wavelength bands of the second electrode 640 of the fourth subpixel P4 can be set to be lower than that of the second electrodes 610, 620 and 630 of the first to third subpixels P1 to P3. Therefore, reflectance of a white (W) pixel, which is most sensitive to visibility reflectance characteristic, can be reduced, whereby panel reflectance can be reduced.

Figure 8G:
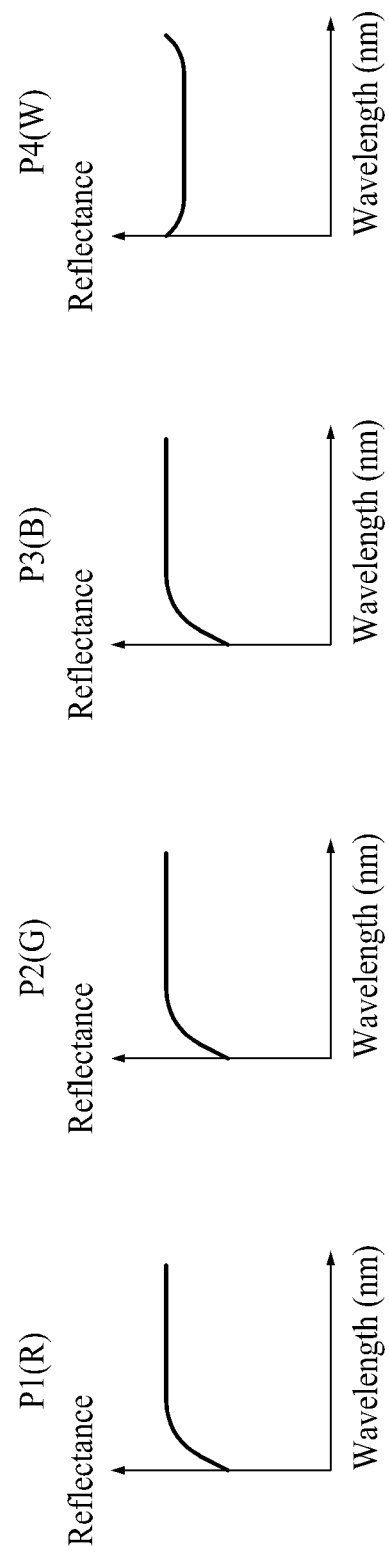

Otherwise, referring to FIG. 8G, light reflectance of a wavelength band of blue (B) light of the second electrode 640 of the fourth subpixel P4, that is, light reflectance of a wavelength band of 400 nm to 500 nm can be set to be higher than that of blue (B) light of the second electrodes 610, 620 and 630 of the first to third subpixels P1 to P3. Therefore, luminance of the blue (B) light can be improved to enhance a color temperature of the white (W) light.

Figure 8H:
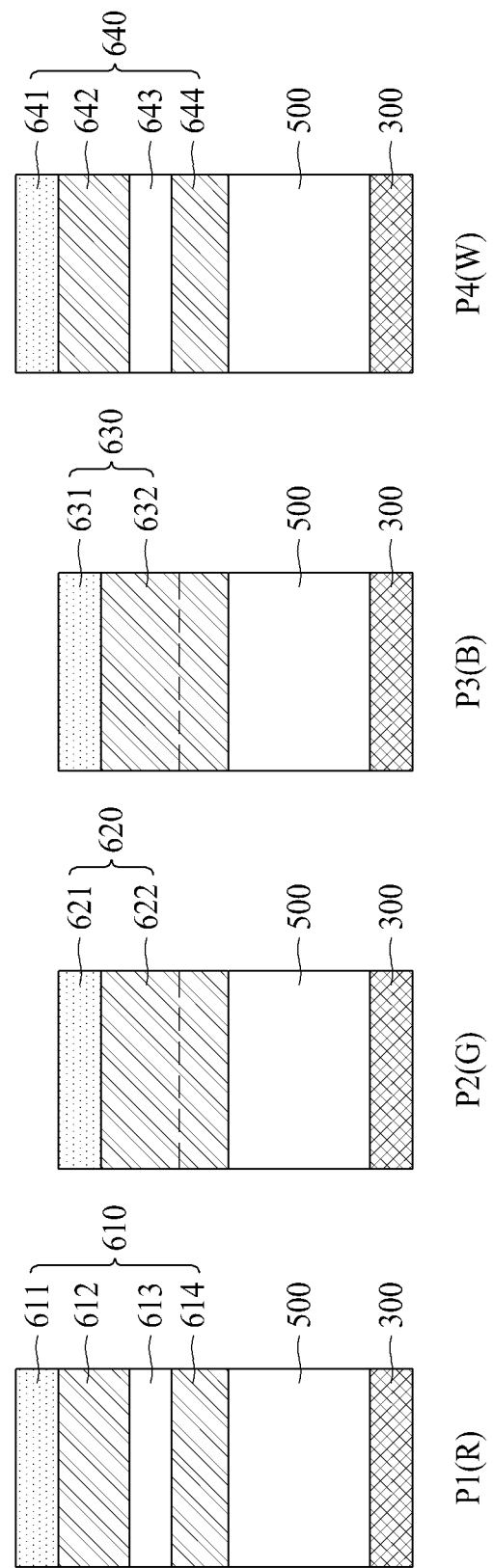

Referring to FIG. 8H, the second electrodes 610 and 640 of the first and fourth subpixels P1 and P4 can have the same structure. That is, the second electrodes 610 and 640 of the first and fourth subpixels P1 and P4 can include light-absorbing layers 611 and 641, second transflective electrodes 612 and 642, transparent electrodes 613 and 643, and third transflective electrodes 614 and 644, respectively. At this time, the material and the thickness, which constitute each of the light-absorbing layer 611, the second transflective electrode 612, the transparent electrode 613 and the third transflective electrode 614, can be adjusted to precisely set the spectrum of reflectance for each wavelength band of the light. In addition, the light-absorbing layers 611, 621, 631 and 641 of the first electrodes 610, 620, 630 and 640 of the first to fourth subpixels P1 to P4 may not be formed.

Figure 8I:
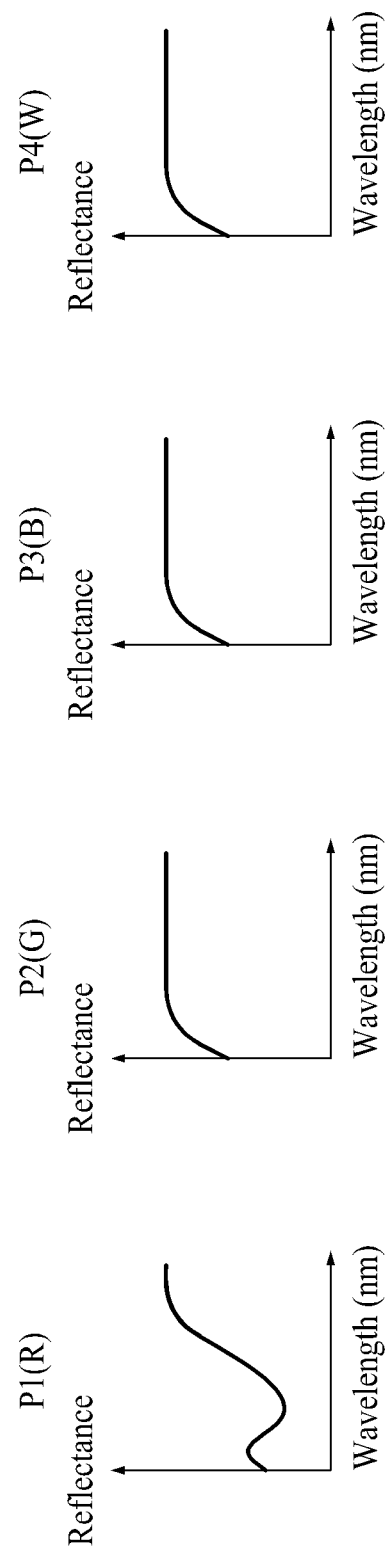

For example, referring to FIG. 8I, reflectance of a wavelength band of red (R) light of the second electrode 610 of the first subpixel P1 can be set to be higher than that of red (R) light of the second electrodes 620, 630 and 640 of the second to fourth subpixels P2 to P4. In addition, reflectance of the wavelength band of the green (G) light and blue (B) light of the second electrode 610 of the first subpixel P1 can be set to be lower than that of the green (G) light and blue (B) light of the second electrodes 620, 630 and 640 of the second to fourth subpixels P2 to P4. Therefore, a pure color of the red (R) light can be improved.

FIGS. 9A to 9D are schematic cross-sectional views illustrating another example of a light emission area of first to fourth subpixels of a display apparatus according to the second embodiment of the present disclosure.

Figure 9A:
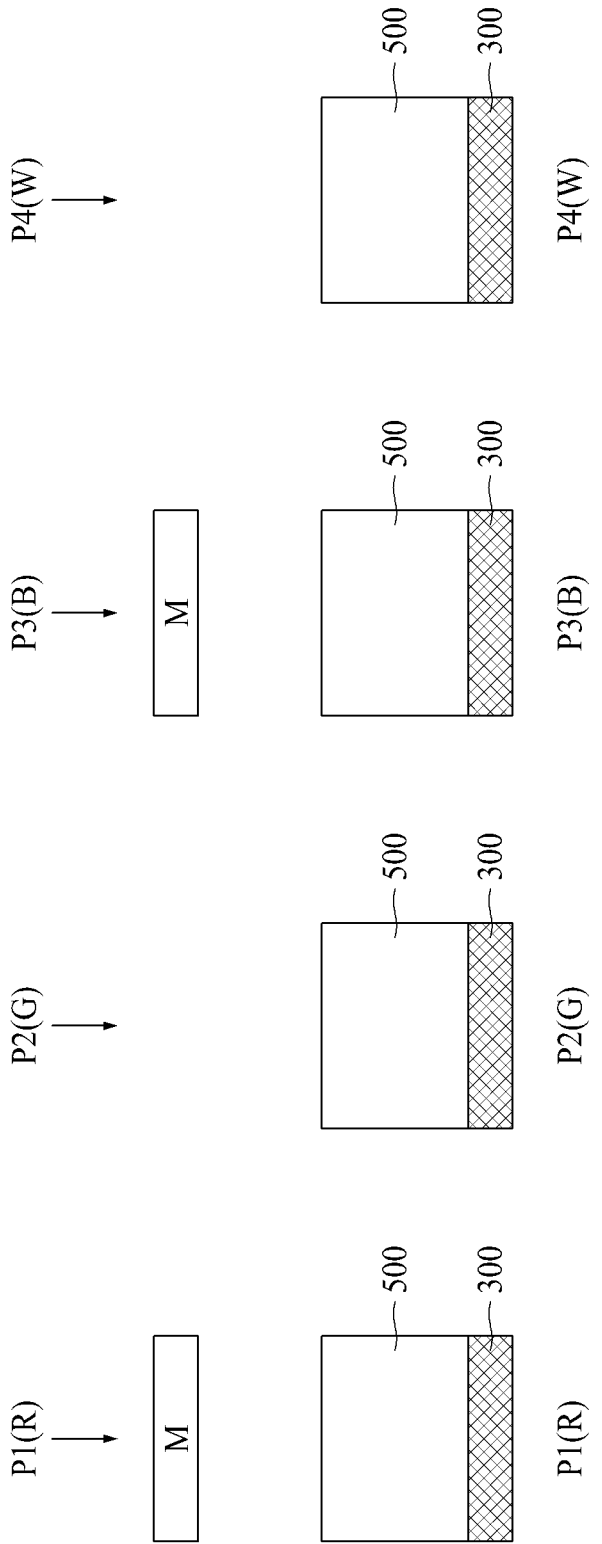
FIGS. 9A to 9D are schematic cross-sectional views illustrating another example of a light emission area of first, second, third and fourth subpixels of a display apparatus according to an embodiment of the present disclosure.

Referring to FIG. 9A, a first electrode 300 and a light-emitting layer 500 are sequentially formed in the first, second, third and fourth subpixels P1 to P4. At this time, the uppermost layer of the light-emitting layer 500 can be made of a photo-sensitive material to have a property in which a specific metal material is attached to or not attached to a surface depending on whether ultraviolet rays are irradiated. For example, an electron transporting layer ETL or an electron injecting layer EIL of the light-emitting layer 500 can be made of a photo-sensitive material. A mask M for blocking some areas of the first, second, third and fourth subpixels P1 to P4 and exposing the other areas is disposed on the light-emitting layer 500. For example, as shown in FIG. 9A, the first and third subpixels P1 and P3 can be blocked and the second and fourth subpixels P2 and P4 can be exposed, but are not limited thereto. Ultraviolet rays are irradiated to the first, second, third and fourth subpixels P1 to P4. By the mask M, the ultraviolet rays are not irradiated onto the surface of the light-emitting layer 500 provided in the first and third subpixels P1 and P3, whereas the ultraviolet rays are irradiated onto the surface of the light-emitting layer 500 provided in the second and fourth subpixels P2 and P4.

Figure 9B:
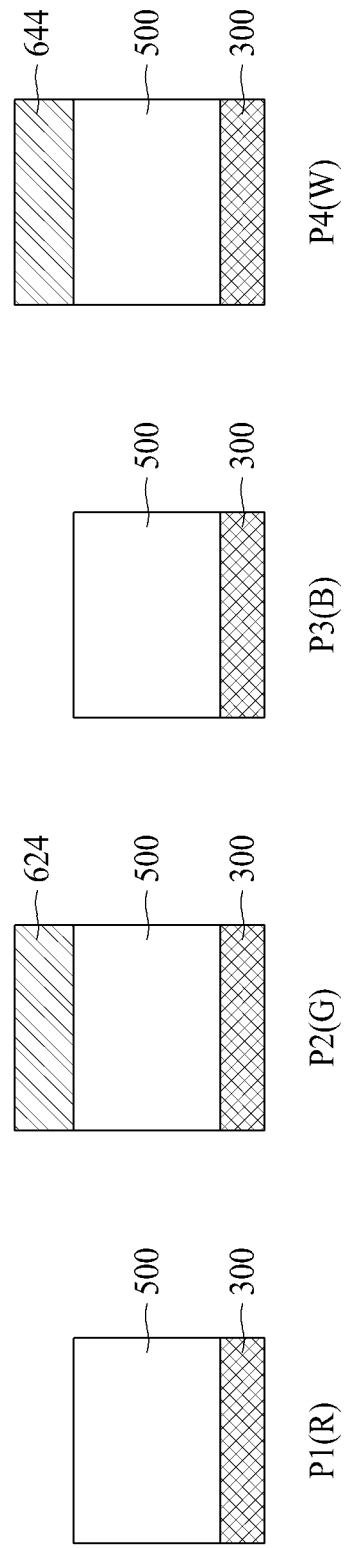

Referring to FIG. 9B, second transflective electrodes 624 and 644 are formed on the light-emitting layer 500. When a metal material is entirely deposited on the first, second, third and fourth subpixels P1 to P4, the metal material can selectively be attached onto only the light-emitting layer 500 of the second and fourth subpixels P2 and P4 to which the ultraviolet rays are irradiated. Therefore, the second transflective electrodes 624 and 644 can selectively be formed only in the second and fourth subpixels P2 and P4.

Figure 9C:
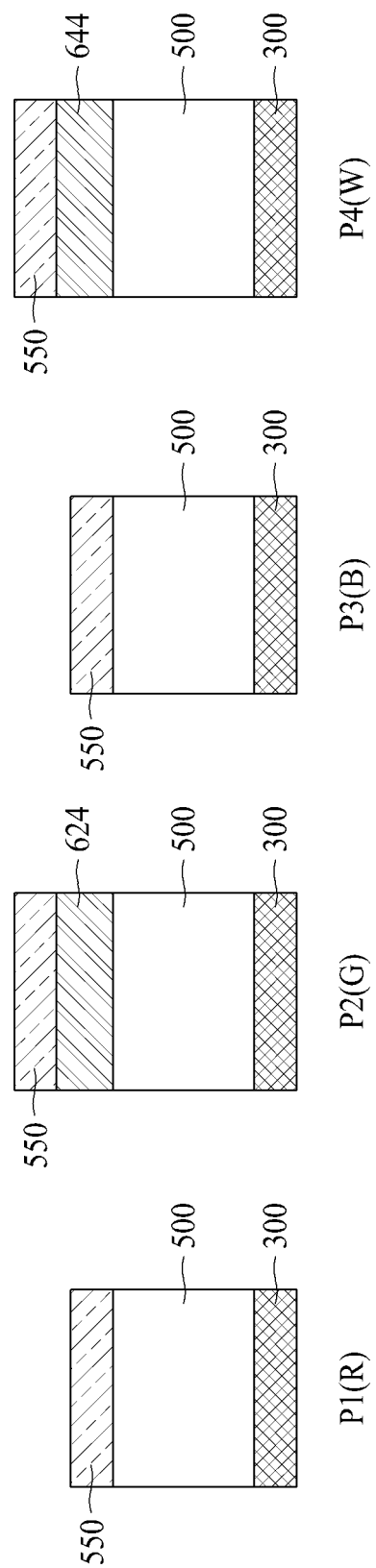

Referring to FIG. 9C, an organic layer 550 is commonly formed in the first, second, third and fourth subpixels P1 to P4. The organic layer 550 has conductivity, and can be made of a transparent organic material. The organic layer 550 can be formed on the light-emitting layer 500 in the first and third subpixels P1 and P3, and can be formed on the second transflective electrodes 624 and 644 in the second and fourth subpixels P2 and P4. The organic layer 500 can fill a space between the second transflective electrode 624 of the second subpixel P2 and the second transflective electrode 644 of the fourth subpixel area P4, and can stably maintain a distance between the second semi-transmission electrodes 624 and 644 adjacent to each other. In addition, the organic layer 550 can include the same material as that of the electron transporting layer ETL or the electron injecting layer EIL, thereby further improving efficiency of the light-emitting layer 500.

Figure 9D:
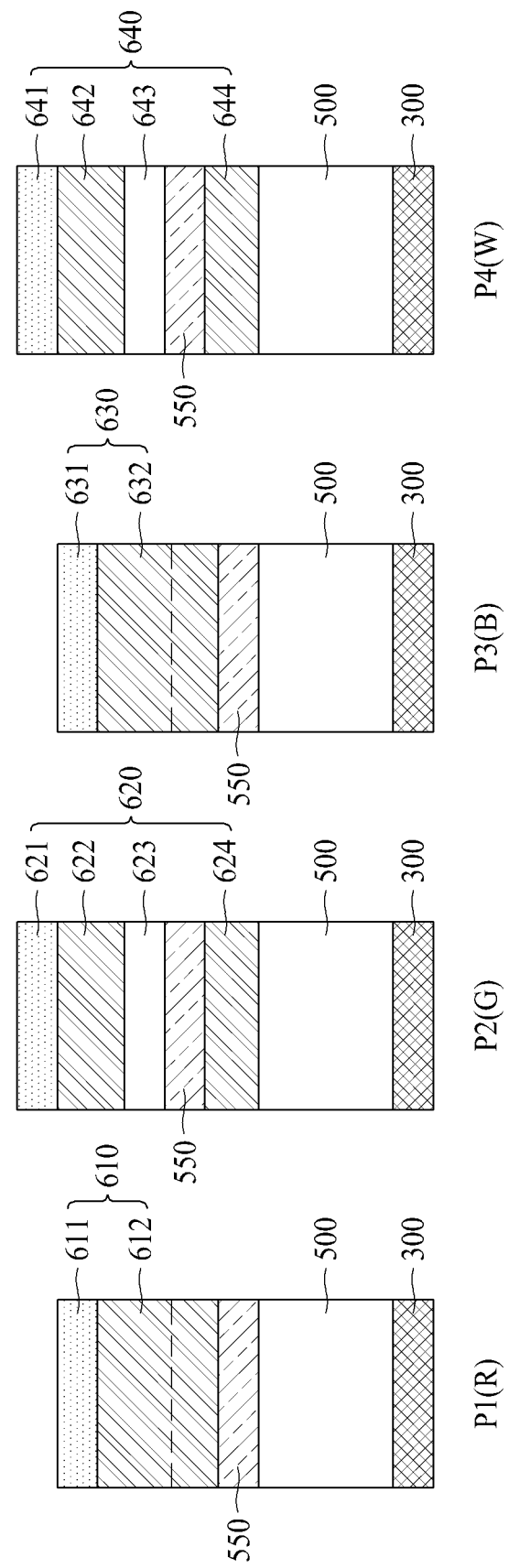

Referring to FIG. 9D, first transflective electrodes 612 and 632 and light-absorbing layers 611 and 631 are sequentially formed on the organic layer 550 in the first and third subpixels P1 and P3. The transparent electrodes 623 and 643, the second transflective electrodes 622 and 642 and the light-absorbing layers 621 and 641 are sequentially formed on the organic layer 550 in the second and fourth subpixels P2 and P4. Therefore, referring to FIGS. 9A to 9D, in the process of forming the light emission area of the first, second, third and fourth subpixels of the display apparatus, the uppermost layer of the light-emitting layer 500 includes a photo-sensitive material, so that the second transflective electrodes 624 and 644 can selectively be formed in a specific subpixel area. In addition, the light-absorbing layers 611, 621, 631 and 641 of the second electrodes 610, 620, 630 and 640 of the first, second, third and fourth subpixels P1 to P4 may not be formed.

According to the present disclosure, the following advantageous effects can be obtained.

According to the present disclosure, as the electrode structure including a plurality of transflective electrodes, a transparent electrode and a light-absorbing layer is formed, reflectance of external light can be reduced for each subpixel area, and visibility of the panel can be improved.

It will be apparent to those skilled in the art that the present disclosure described above is not limited by the above-described embodiments and the accompanying drawings and that various substitutions, modifications and variations may be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:
1. A display apparatus comprising:
   a first subpixel and a second subpixel provided on a substrate;
   a first electrode in each of the first subpixel and the second subpixel;
   a light-emitting layer provided on the first electrode in each of the first and second subpixels; and
   a second electrode provided on the light-emitting layer, wherein a structure of the first electrode in the first subpixel is different than a structure of the first electrode in the second subpixel, wherein the first electrode in the first subpixel includes a first transflective electrode, wherein the first electrode in the second subpixel includes a second transflective electrode, a third transflective electrode and a first transparent electrode, wherein the first transparent electrode is disposed between the second transflective electrode and the third transflective electrode, wherein the first transflective electrode is thicker than the second transflective electrode, wherein the first transflective electrode is thicker than the third transflective electrode, and wherein the second transflective electrode is thicker than the third transflective electrode.

2. The display apparatus of claim 1,
wherein each of the first, second and third transflective electrodes is configured to reflect some external light and pass some of the external light.

3. The display apparatus of claim 2, wherein the first electrode in the first subpixel further includes a light-absorbing layer provided below the first transflective electrode.

4. The display apparatus of claim 3, wherein the first electrode in the second subpixel further includes a light-absorbing layer provided below the second transflective electrode,
the first transparent electrode is provided on the second transflective electrode, and
the third transflective electrode is provided on the first transparent electrode.

5. The display apparatus of claim 4, wherein the first electrode in the second subpixel further includes a second transparent electrode, and
the second transparent electrode is between the light-absorbing layer and the second transflective electrode.

6. The display apparatus of claim 4, wherein the first electrode in the second subpixel further includes a second transparent electrode, and
the second transparent electrode is provided between the third transflective electrode and the light-emitting layer.

7. The display apparatus of claim 4, wherein the first electrode in the second subpixel further includes a reflective electrode, and
the reflective electrode is provided below the light-absorbing layer.

8. The display apparatus of claim 2, wherein the first, second and third transflective electrodes are made of a same material, and
a thickness of the first transflective electrode is approximately equal to a sum of a thickness of the second transflective electrode and a thickness of the third transflective electrode.

9. The display apparatus of claim 1, further comprising:
a third subpixel and a fourth subpixel disposed on the substrate, each of the first and fourth subpixels including a first electrode,
wherein a structure of the first electrode in the third subpixel is the same as a structure of the first electrode in the first subpixel,
a structure of the first electrode in the fourth subpixel is the same as a structure of the first electrode in the second subpixel, and
the first electrode in each of the first and third subpixels has a different structure than the first electrode in each of the second and fourth subpixels.

10. The display apparatus of claim 9, wherein the first subpixel is configured to emit red light, the second subpixel is configured to emit green light, the third subpixel is configured to emit blue light, and the fourth subpixel is configured to emit white light.

* * * * *